(12) United States Patent
Bhattacharyya et al.

(10) Patent No.: US 6,597,049 B1
(45) Date of Patent: Jul. 22, 2003

(54) CONDUCTOR STRUCTURE FOR A MAGNETIC MEMORY

(75) Inventors: Manoj Bhattacharyya, Cupertino, CA (US); Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/132,998

(22) Filed: Apr. 25, 2002

(51) Int. Cl.[7] ............................ H01L 23/48; H01L 43/00
(52) U.S. Cl. ...................... 257/421; 257/422; 257/428; 257/775
(58) Field of Search .................. 257/421, 422, 257/428, 29.118, 29.17, 773, 775; 438/128, FOR 468

(56) References Cited

U.S. PATENT DOCUMENTS

| | | | |
|---|---|---|---|
| 6,236,590 B1 | 5/2001 | Bhattacharyya et al. | .... 365/173 |
| 6,331,944 B1 * | 12/2001 | Monsma et al. | ............ 365/171 |
| 6,404,673 B1 * | 7/2002 | Matsui | ........................ 365/173 |
| 6,480,411 B1 * | 11/2002 | Koganei | ...................... 365/158 |
| 6,498,747 B1 * | 12/2002 | Gogl et al. | .................. 365/158 |
| 6,504,221 B1 * | 1/2003 | Tran et al. | .................. 257/421 |
| 2001/0025978 A1 * | 10/2001 | Nakao | ........................ 257/314 |

* cited by examiner

*Primary Examiner*—Jasmine J B Clark
(74) *Attorney, Agent, or Firm*—Trueman H. Denny, III

(57) ABSTRACT

A conductor structure for a magnetic memory is disclosed. The conductor structure includes one or more conductors that have a width that is less than a dimension of a memory cell in a direction the conductor crosses the memory cell. A thickness of the conductor is preselected to reduce a cross-sectional area of the conductor and increase a current density within the conductor. A magnetic field sufficient to rotate an alterable orientation of magnetization in a data layer of the memory cell can be generated by a reduced magnitude of a current flowing in the conductor due to the increased current density. Alternatively, the magnitude of the current can be reduced by increasing a thickness of the conductor to increase its area and reduce its resistance to the flow of electrons and partially cladding the conductor to reduce a total magnetic path around the conductor thereby increasing the magnetic field.

18 Claims, 15 Drawing Sheets

Binary "1"    Binary "0"

CONDUCTOR STRUCTURE FOR A MAGNETIC MEMORY

FIELD OF THE INVENTION

The present invention relates generally to a conductor structure for a magnetic memory device. More specifically, the present invention relates to a conductor structure for a magnetic memory device in which a cross-sectional area of a conductor is decreased to increase a current density in the conductor or in which the cross-sectional area is increased to reduce a resistance to a flow of electrons in the conductor and the conductor is partially cladded to increase a magnetic field such that a reduced amount of current is required to write a bit of data to the magnetic memory device.

BACKGROUND OF THE ART

Magnetic Random Access Memory (MRAM) is an emerging technology that can provide an alternative to traditional data storage technologies. MRAM has desirable properties including fast access times like DRAM and non-volatile data retention like hard disc drives. MRAM stores a bit of data (i.e. information) as an alterable orientation of magnetization in a patterned thin film magnetic element that is referred to as a data layer, a storage layer, or a data film. The data layer is designed so that it has two stable and distinct magnetic states that define a binary one ("1") and a binary zero ("0"). Although the bit of data is stored in the data layer, many layers of carefully controlled magnetic and dielectric thin film materials are required to form a complete magnetic memory element. One prominent form of magnetic memory element is a spin tunneling device. The physics of spin tunneling is complex and good literature exits on this subject.

In FIG. 1a, a prior MRAM memory element 101 includes a data layer 102 and a reference layer 104 that are separated by a thin barrier layer 106. Typically the barrier layer 106 has a thickness that is less than about 2.0 nm. The memory element 101 has a width W and a height H and a ratio of the width W to the height H defines an aspect ratio (i.e. aspect ratio=W÷H). In a tunneling magnetoresistance (TMR) structure the barrier layer 106 is an electrically non-conductive dielectric material such as aluminum oxide ($Al_2O_3$), for example. Whereas, in a giant magnetoresistance (GMR) structure the barrier layer 106 is a thin layer of conductive material such as copper (Cu), for example. The reference layer 104 has a pinned orientation of magnetization 108, that is, the pinned orientation of magnetization 108 is fixed in a predetermined direction and does not rotate in response to an external magnetic field. In contrast the data layer 102 has an alterable orientation of magnetization 103 that can rotate between two orientations in response to an external magnetic field.

In FIG. 1b, when the pinned orientation of magnetization 108 and the alterable orientation of magnetization 103 point in the same direction (i.e. they are parallel to each other) the data layer 102 stores a binary one ("1"). On the other hand, when the pinned orientation of magnetization 108 and the alterable orientation of magnetization 103 point in opposite directions (i.e. they are anti-parallel to each other) the data layer 102 stores a binary zero ("0").

In FIG. 2, the prior memory element 101 is typically positioned at an intersection of two orthogonal conductors 105 and 107. For instance, the conductor 105 can be a word line and the conductor 107 can be a bit line. A bit of data is written to the memory element 101 by generating two magnetic fields $H_X$ and $H_Y$ that are in turn generated by currents $I_Y$ and $I_X$ flowing in the conductors 107 and 105 respectively. The magnetic fields $H_X$ and $H_Y$ cooperatively interact with the data layer 102 to rotate the alterable orientation of magnetization 103 from its current orientation to a new orientation. Therefore, if the current orientation is parallel (i.e. positive x-direction on the x axis) with the pinned orientation of magnetization 108 such that a binary "1" is stored in the data layer 102, then the magnetic fields $H_X$ and $H_Y$ will rotate the alterable orientation of magnetization 103 to an anti-parallel orientation (i.e. negative x-direction on the x axis) such that a binary "0" is stored in the data layer 102.

In FIG. 3, the prior memory element 101 is positioned in a large array 201 of similar memory elements 101 that are also positioned at an intersection of a plurality of the conductors 107 and 105 that are arranged in rows and columns. For purposes of illustration, in FIG. 3, the conductors 107 are bit lines and the conductors 105 are word lines. The conductors (105, 107) need not be in direct contact with the memory element 101. Typically, one or more layers of material separate the conductors (105, 107) from the data layer 102 and the reference layer 104.

A bit of data is written to a selected one of the memory elements 101 that is positioned at an intersection of a word and bit line by passing the currents $I_Y$ and $I_X$ through the word and bit lines. During a normal write operation the selected memory element 101 will be written to only if the combined magnetic fields $H_X$ and $H_Y$ are of a sufficient magnitude to switch (i.e. rotate) the alterable orientation of magnetization of the memory element 101.

One disadvantage of the prior memory element 101 is that the conductors 107 and 105 have a nominal thickness denoted as $t_N$ and a width $W_B$ and $W_W$ respectively that are substantially equal to the width W and height H of the memory element 101. In FIG. 4, a cross-sectional view of the memory element 101 along the y-axis Y illustrates the conductor 107 as having a width $W_B$ that is substantially equal to the width W of the memory element 101. Similarly, a cross-sectional view of the memory element 101 along the x-axis X illustrates the conductor 105 as having a width $W_W$ that is substantially equal to the height H of the memory element 101.

As a result of the above mentioned thicknesses $t_N$ and widths ($W_B$ and $W_W$), the magnitude of the currents $I_Y$ and $I_X$ required to generate the combined magnetic fields $H_X$ and $H_Y$ is high. There are several disadvantages to high currents. First, the transistor driver circuits for sourcing those currents are sized based on the amount of current required. Consequently, higher currents require larger driver circuits. As the dimensions of the memory elements 101 shrink to increase areal density, it is desirable to also shrink the size of the driver circuits so that the amount of area occupied by the array 201 is minimized.

Second, in portable electronics applications where the power source is typically a battery, high current demands result in a reduction in battery life and can require larger and heavier batteries. It is desirable to reduce weight, size, and to increase battery life for longer operating times.

Finally, in low power applications, the waste heat generated by a microelectronic device is proportional to the amount of current supplied. Therefore, waste heat generation increases with higher current demands. Excessive waste heat generation can elevate the temperature of the device, often with deleterious effects.

U.S. Pat. No. 6,236,590 to Bhattacharyya et al., discloses a conductor layout structure in which the amount of current required to switch the data layer is reduced by reducing the width of the conductors such that the edges of the conductors are within the width or the length of the memory element in the direction the conductor crosses the memory element. However, further reductions in current are required as the dimensions of magnetic memory elements continue to shrink. Therefore, there is room for further reductions in current consumption during write operations in MRAM devices.

Consequently, there exists a need for a conductor structure for a magnetic memory cell that provides optimal use of current to switch the data layer of the memory cell. There is also a need for a conductor structure for a magnetic memory cell that uses the available current more efficiently than the prior conductor structures. There exists a need for a conductor structure for a magnetic memory cell that reduces the need for high current driver circuits. Finally, there is a need for a conductor structure for a magnetic memory cell that further reduces current consumption during write operations to the memory cell.

SUMMARY OF THE INVENTION

The present invention address the above mentioned needs by using a conductor structure in which a width and a thickness of the conductor is reduced to increase a current density in the conductor so that a magnitude of a magnetic field sufficient to switch an alterable orientation of magnetization of a data layer of a memory cell can be generated by a reduced magnitude of current flowing in the conductor. Essentially, as the conductor width and thicknesses are decreased, a switching current requirement also decreases. The reduction in conductor width and thickness can be relative to a nominal width and a nominal thickness. Furthermore, the reduction in conductor width and thickness can be on one or more conductors that are operative to write data to the data layer of the memory cell.

In an alternative embodiment of the present invention, a width of the conductor is reduced and a thickness of the conductor is increased so that a resistance to the flow of a current in the conductor is reduced. The conductor is partially cladded with a soft magnetic material so that the magnetic field is increased and a magnitude of a magnetic field sufficient to switch an alterable orientation of magnetization of the data layer of the memory cell can be generated by a reduced magnitude of current flowing in the conductor. The reduction in conductor width and the increase in conductor thickness can be relative to a nominal width and a nominal thickness. The decrease in conductor width and the increase in conductor thickness can be on one more conductors that are operative to write data to the data layer of the memory cell.

In another embodiment of the present invention, the conductors are split into two or more spaced apart segments. The spaced apart segment can also be partially cladded.

Other aspects and advantages of the present invention will become apparent from the following detailed description, taken in conjunction with the accompanying drawings, illustrating by way of example the principles of the present invention.

DETAILED DESCRIPTION

Figure 1A:
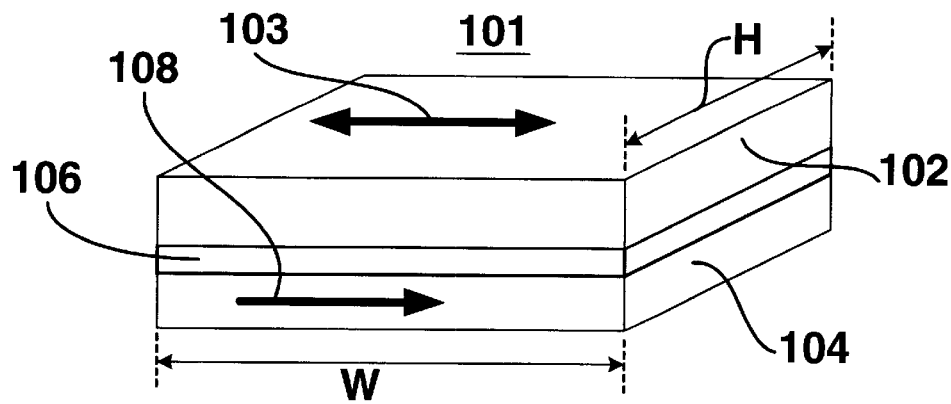
FIGS. 1a and 1b are a profile view and a schematic view respectively of a prior magnetic memory element.
Figure 1B:
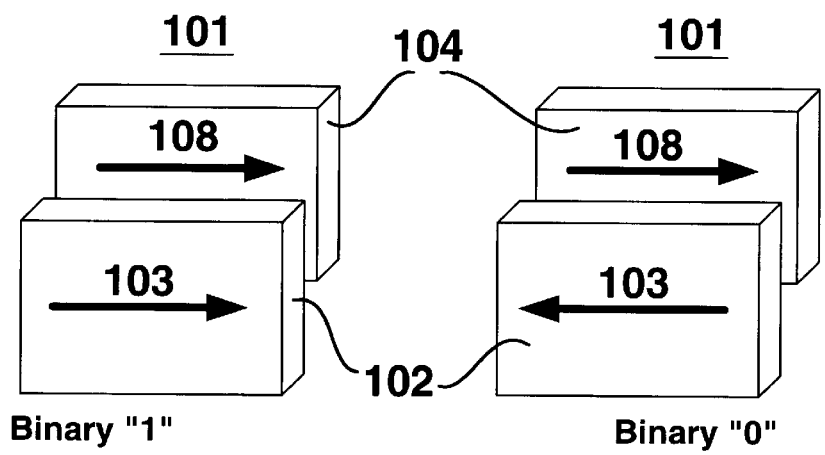
Figure 2:
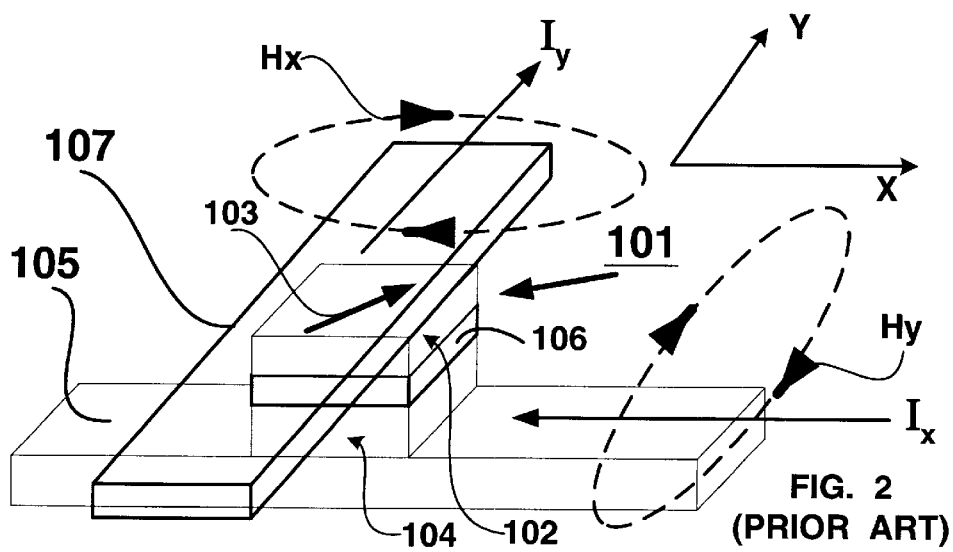
FIG. 2 is a profile view of a write conductor layout for a prior magnetic memory element.
Figure 3:
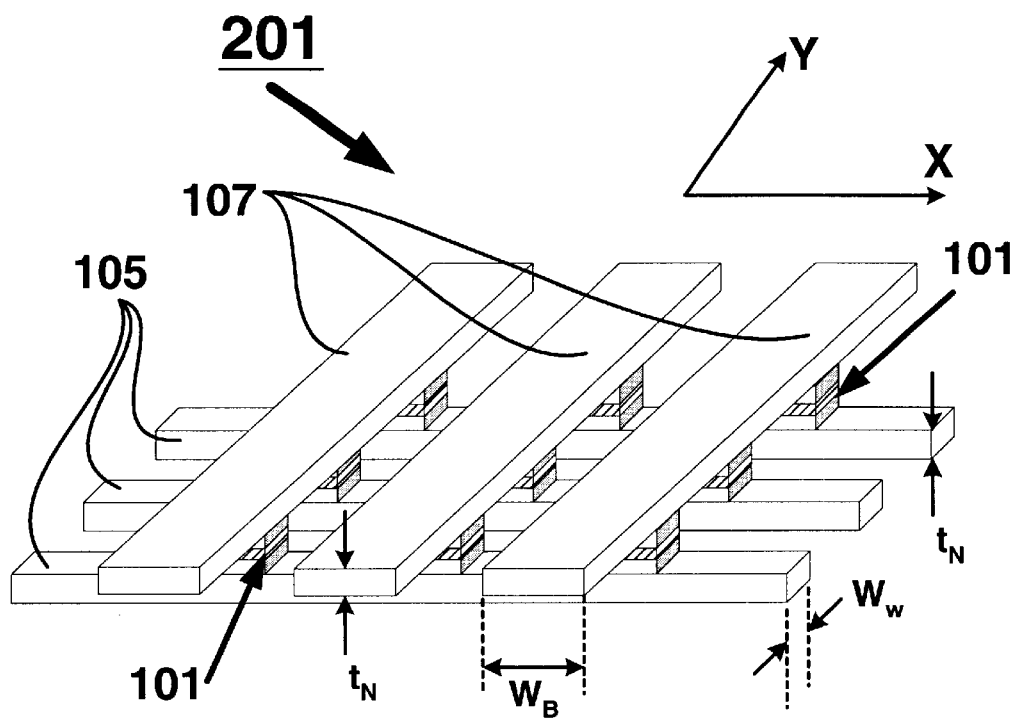
FIG. 3 is a profile view of a prior array of magnetic memory elements.
Figure 4:
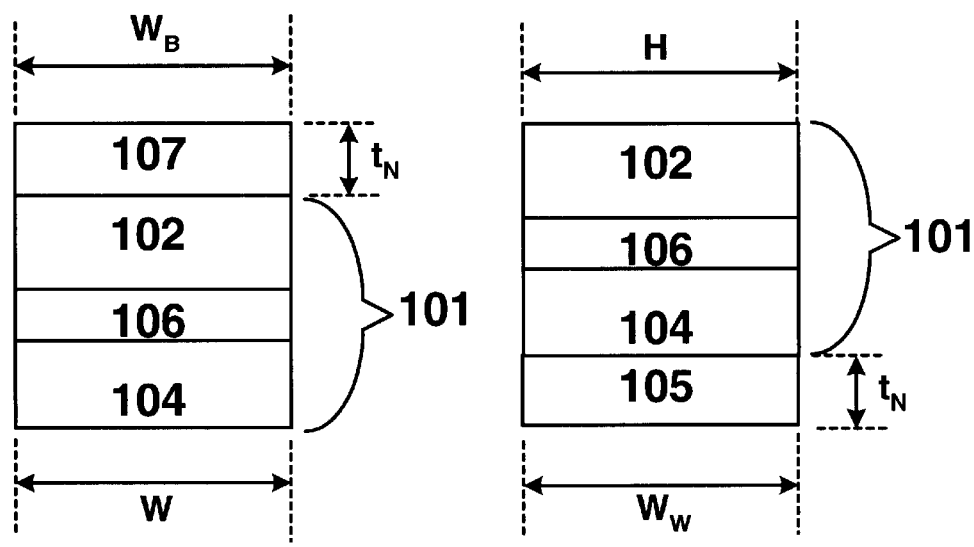
FIG. 4 is a cross-sectional view depicting dimensional relationships between prior write conductors and a prior magnetic memory element.

In the following detailed description and in the several figures of the drawings, like elements are identified with like reference numerals.

As shown in the drawings for purpose of illustration, the present invention is embodied in a conductor structure for a magnetic memory device. The magnetic memory device includes a magnetic field sensitive memory cell including a width, a length, and a data layer for storing a bit of data as an alterable orientation of magnetization. A first conductor crosses the memory cell in a width direction and a second conductor crosses the memory cell in a length direction. The first and second conductors are operative to generate a first magnetic field in response to a first current flowing in first conductor and a second magnetic field in response to a second current flowing in the second conductor. The first and second magnetic fields cooperatively interact with the data layer to rotate the alterable orientation of magnetization thereby writing a new bit of data to the data layer.

The first conductor includes a first width and a first thickness that define a first cross-sectional area, a top surface, two side surfaces that are positioned within the width of the memory cell, and a bottom surface that is positioned adjacent to the memory cell.

The second conductor includes a second width and a second thickness that define a second cross-sectional area, a top surface, two side surfaces, and a bottom surface that is positioned adjacent to the memory cell.

The first thickness of the first conductor is preselected to decrease the first cross-sectional area thereby increasing a current density in the first conductor. As a result, a magnitude of the first magnetic field that is sufficient to rotate the alterable orientation of magnetization in cooperation with the second magnetic field is generated by a reduced magnitude of the first current. Consequently, power consumption is reduced and waste heat generation is also reduced.

Further reductions in power consumption are realized by positioning the two side surfaces of the second conductor within the length of the memory cell and preselecting the second thickness to decrease the second cross-sectional area thereby increasing a current density in the second conductor. Consequently, a magnitude of the second magnetic field that is sufficient to rotate the alterable orientation of magnetization in cooperation with the first magnetic field is generated by a reduced magnitude of the second current.

In an alternative embodiment of the present invention, the two side surfaces of the first conductor are positioned within the width of the memory cell and the top surface and/or the two side surfaces of the first conductor are covered by a first cladding layer that operatively increases the first magnetic field. The first thickness is preselected to increase the first cross-sectional area such that a resistance of the first conductor is reduced and a magnitude of the first magnetic field that is sufficient to rotate the alterable orientation of magnetization in cooperation with the second magnetic field is generated by a reduced magnitude of the first current.

Power consumption is further reduced by positioning the two side surfaces of the second conductor within the length of the memory cell and covering the top surface and/or the two side surfaces of the second conductor with a second cladding layer that operatively increases the second magnetic field. The second thickness is preselected to increase the second cross-sectional area such that a resistance of the second conductor is reduced and a magnitude of the second magnetic field that is sufficient to rotate the alterable orientation of magnetization in cooperation with the first magnetic field is generated by a reduced magnitude of the second current. The first and second cladding layers are made from a ferromagnetic material.

Figure 5A:
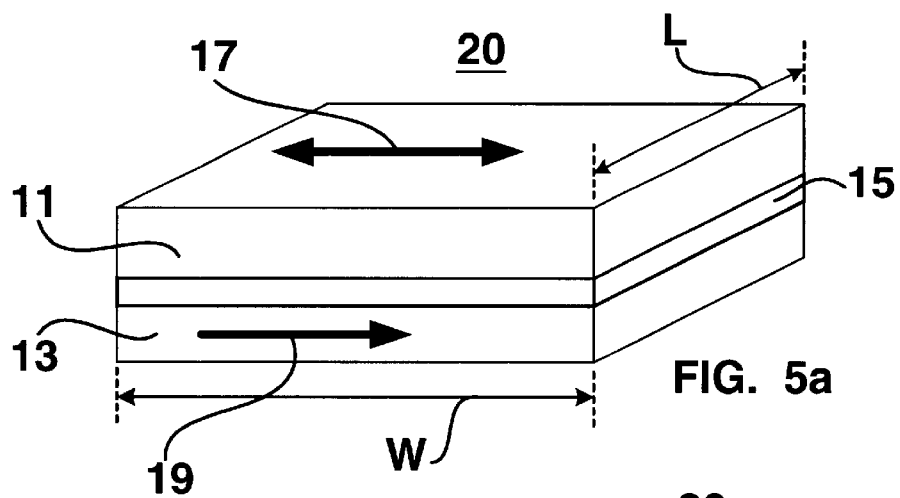
FIG. 5a is a profile view of a magnetic field sensitive memory cell according to the present invention.
Figure 5B:
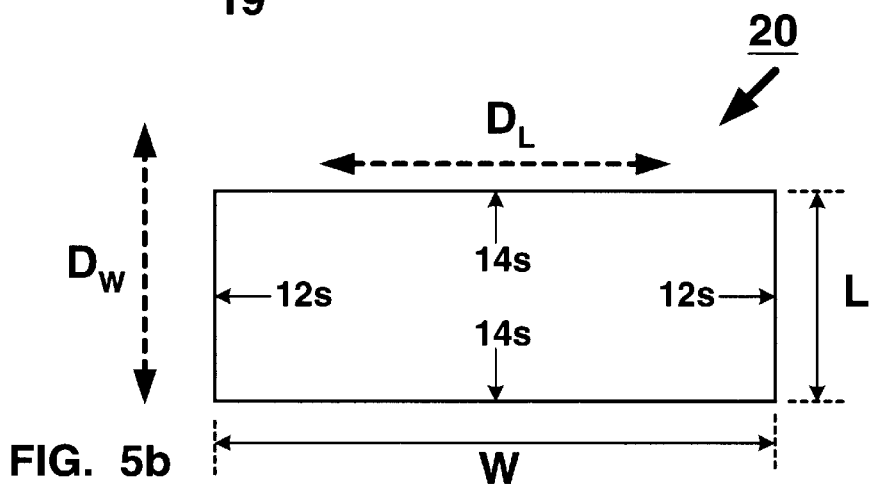
FIG. 5b is a top plan view depicting a width and a length of the memory cell according to the present invention.

In FIGS. 5a and 5b, a magnetic field sensitive memory cell 20 includes a data layer 11, a reference layer 13, and a barrier layer 15 that is positioned between the data layer 11 and the reference layer 13. The memory cell 20 has a width W and a length L that define an aspect ratio AR=W÷L. The data layer 11 includes an alterable orientation of magnetization 17 and the reference layer 13 includes a pinned orientation of magnetization 19. A bit of data is stored in the data layer 11.

A state of the bit of data is determined by a relative orientation between the pinned orientation of magnetization 19 and the alterable orientation of magnetization 17. For instance, a binary "1" state can be indicated by a parallel orientation in which the pinned orientation of magnetization 19 and the alterable orientation of magnetization 17 point in the same direction. Conversely, a binary "0" state can be indicated by an anti-parallel orientation in which the pinned orientation of magnetization 19 and the alterable orientation of magnetization 17 point in opposite directions.

In FIG. 5b a width direction $D_W$ of the memory cell 20 is substantially perpendicular to the width W dimension and a length direction $D_L$ is substantially perpendicular to the length L dimension. The memory cell 20 has opposed sides 12s in the width direction $D_W$ and opposed sides 14s in the length direction $D_L$. It is well understood in the MRAM art that a magnetic field sensitive memory cell can include a plurality of layers of thin film materials. For purposes of illustration only, all possible layers that can be included in a magnetic field sensitive memory cell are not shown. For instance, the data layer 11, the reference layer 13, and the barrier layer 15 can be comprised of several layers of material although only one layer is illustrated for each. Moreover, although the first and second conductors as described herein are illustrated as being in contact with the data layer 11 and the reference layer 13, those conductors can be separated from the data layer 11 and the reference layer 13 by one or more layers of material.

Figure 5C:
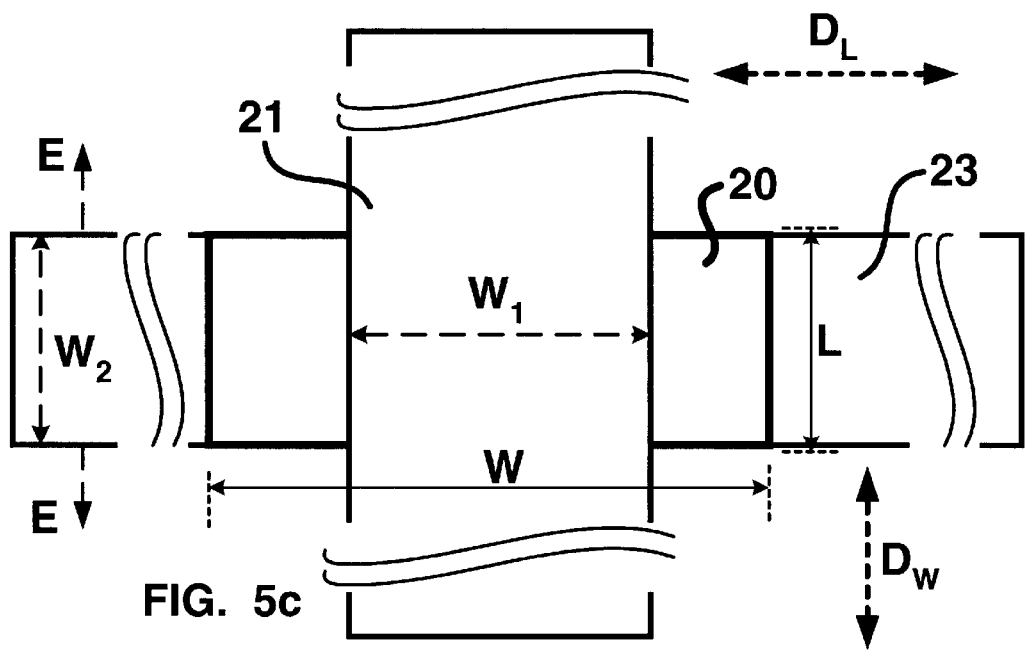
FIGS. 5c and 5d are a top plan views of a first conductor and a second conductor that cross the magnetic memory cell according to the present invention.
Figure 5D:
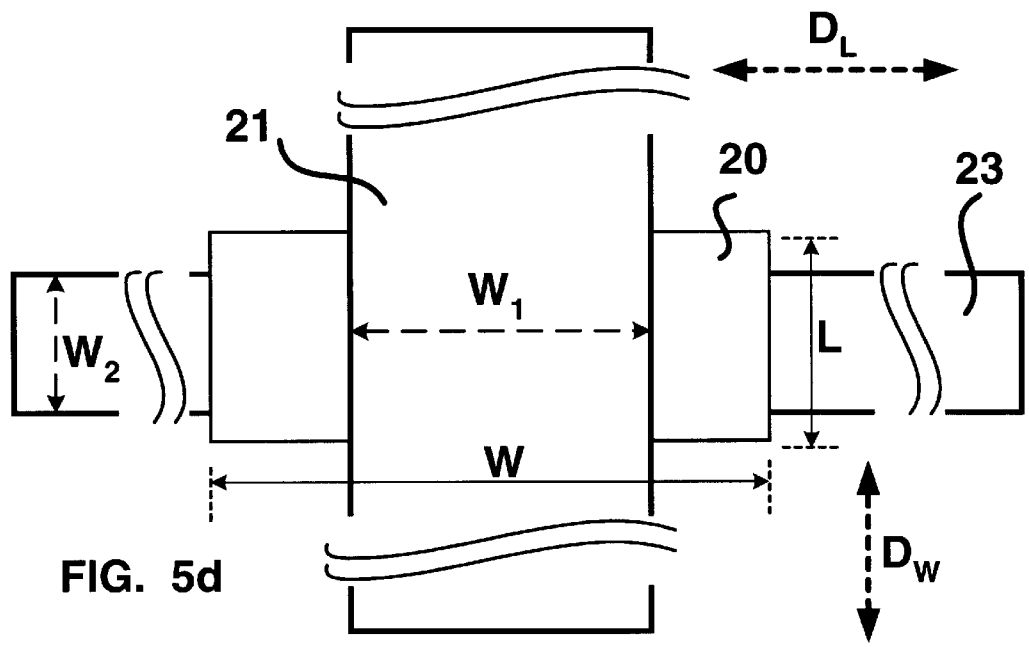
Figure 6A:
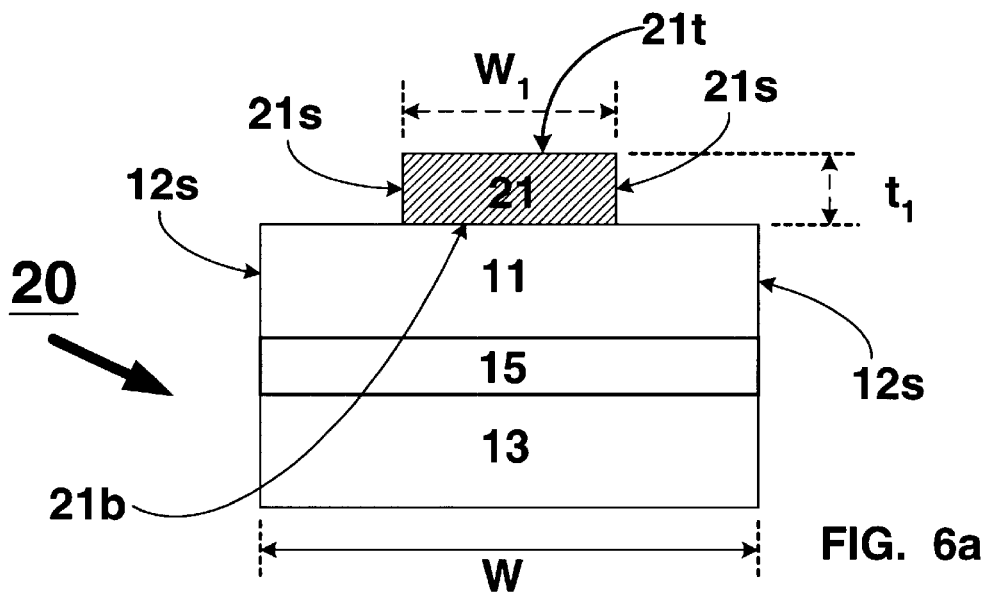
FIGS. 6a and 7a are cross-sectional views of a reduced width and a reduced thickness conductor according to the present invention.
Figure 6B:
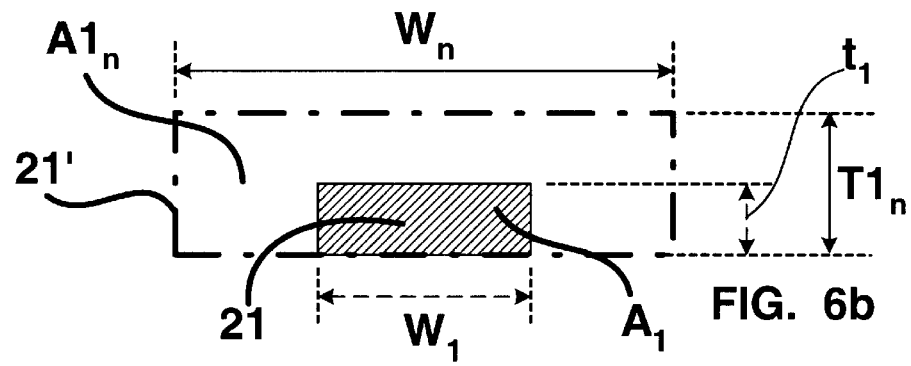
FIGS. 6b and 7b are cross-sectional views depicting the reduced width and reduced thickness conductors of FIGS. 6a and 7a respectively, in relation to a conductor having a nominal width, a nominal length, and a nominal thickness according to the present invention.
Figure 6C:
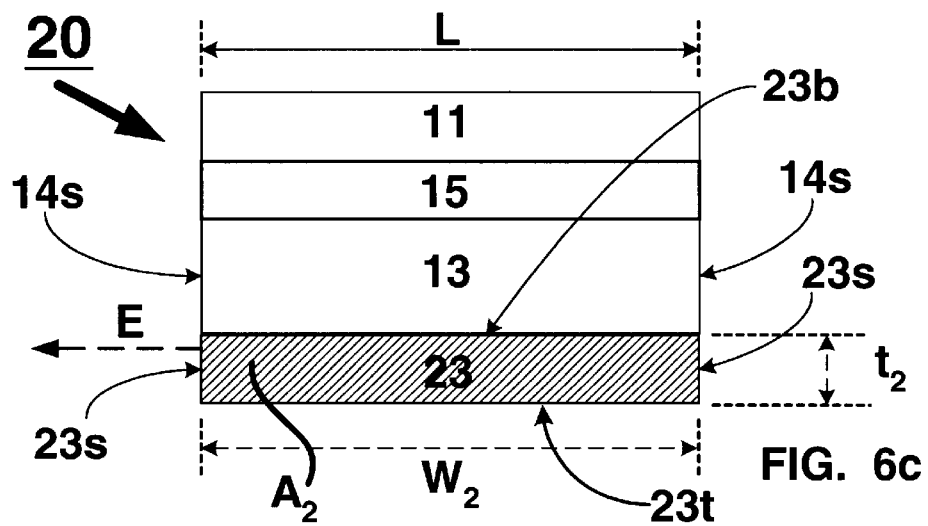
FIG. 6c is a cross-sectional view of a second conductor crossing a memory cell in a length direction according to the present invention.

In FIGS. 5c, 6a, and 6c, a conductor structure for a magnetic memory device includes the memory cell 20, a first conductor 21 crossing the memory cell 20 in the width direction $D_W$, and a second conductor 23 crossing the memory cell 20 in the length direction $D_L$.

In FIG. 6a, the first conductor 21 includes a first width $W_1$ and a first thickness $t_1$ that define a first cross-sectional area $A_1$ (i.e. $A_1=W_1* t_1$). The first conductor 21 also includes a top surface 21t, two side surfaces 21s, and a bottom surface 21b that is adjacent to the memory cell 20 (i.e. the bottom surface 21b is positioned in facing relation to the data layer 11). The two side surfaces 21s are positioned within the width W of the memory cell 20. That is, the two side surfaces 21s are inset from opposed sides 12s of the memory cell 20 such that first width $W_1$ is less than the width W of the memory cell 20 (i.e. $W_1<W$). The first conductor 21 is operative to generate a first magnetic field $H_1$ in response to a first current $I_1$ (not shown) flowing in the first conductor 21.

In FIG. 6c, the second conductor 23 includes a second width $W_2$ and a second thickness $t_2$ that define a second cross-sectional area $A_2$ (i.e. $A_2=W_2*t_2$). The second conductor 23 also includes a top surface 23t, two side surfaces 23s, and a bottom surface 23b that is adjacent to the memory cell 20 (i.e. the bottom surface 23b is positioned in facing relation to the reference layer 13). The second conductor 23 is operative to generate a second magnetic field $H_2$ in response to a second current $I_2$ (not shown) flowing in the second conductor 23. The first and second magnetic fields ($H_1$, $H_2$) cooperatively interact with the data layer 11 to rotate the alterable orientation of magnetization 17.

Figure 8A:
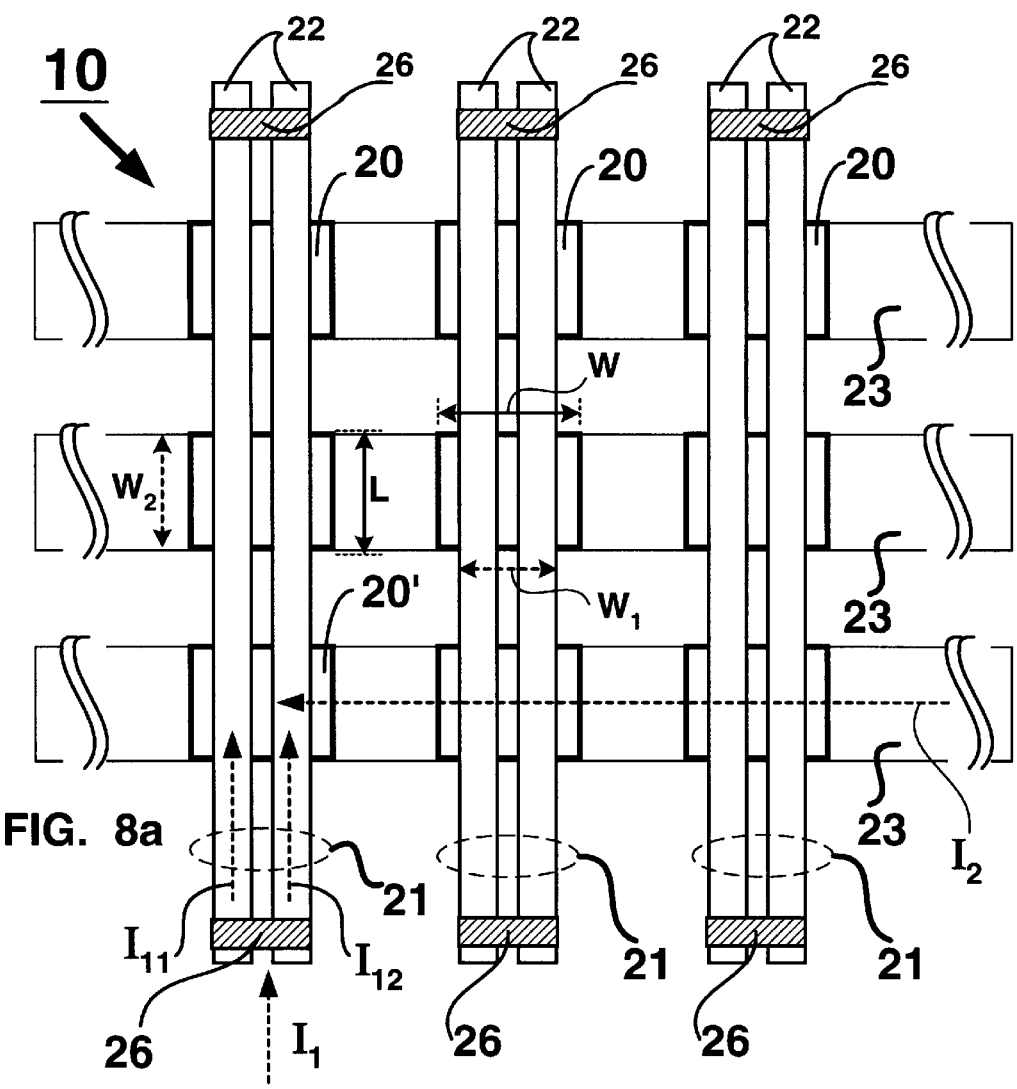
FIGS. 8a, 8b, and 8c are a top view and a cross-sectional view respectively of a conductor that is split into a plurality of spaced apart segments according to the present invention.

In FIGS. 5c, 6c, and 8a, the second width $W_2$ is greater than or equal to the length L of the memory cell 20. The two side surfaces 23s are positioned substantially flush with the opposed sides 14s of the memory cell 20. Alternatively, the two side surfaces 23s can be positioned so that they extend outward of the opposed sides 12s as indicated by dashed arrow E. In either case, the second width $W_2$ is greater than or substantially equal to the length L of the memory cell 20 (i.e. $W_2 \geq L$).

Figure 5E:
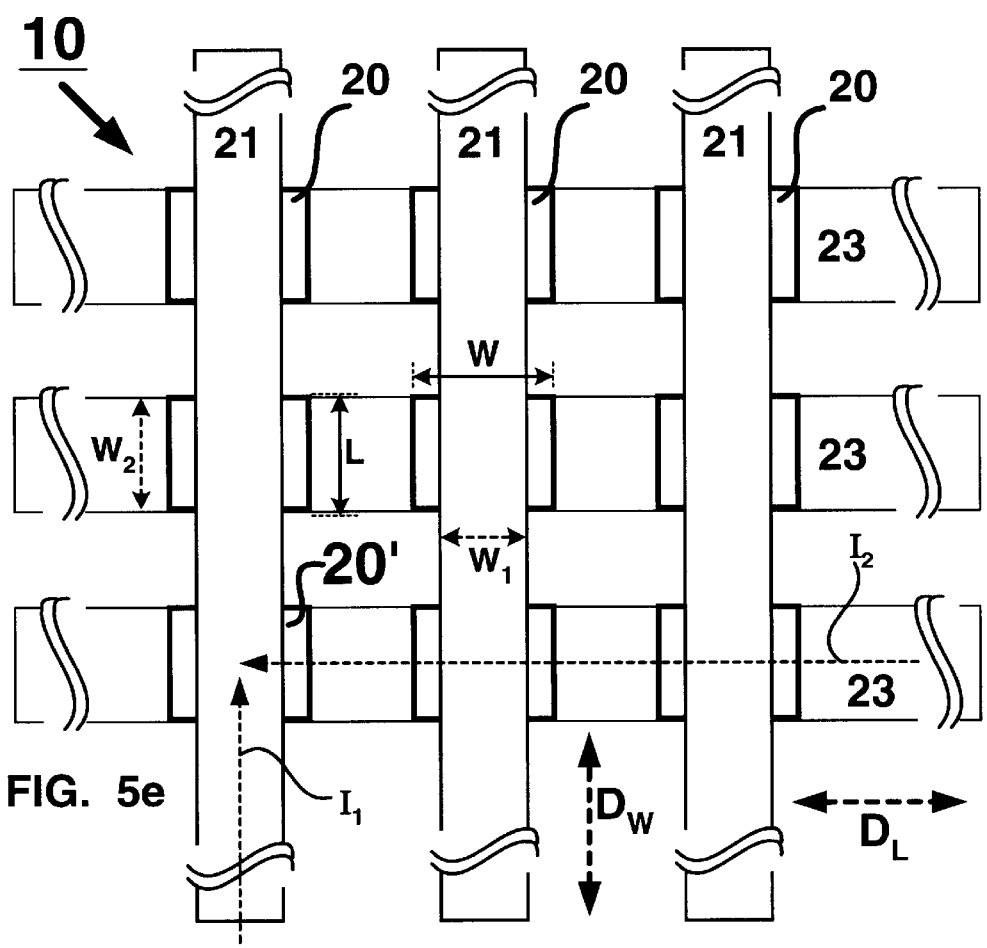
FIGS. 5e and 5f are a schematic view of a magnetic memory device according to the present invention.
Figure 5F:
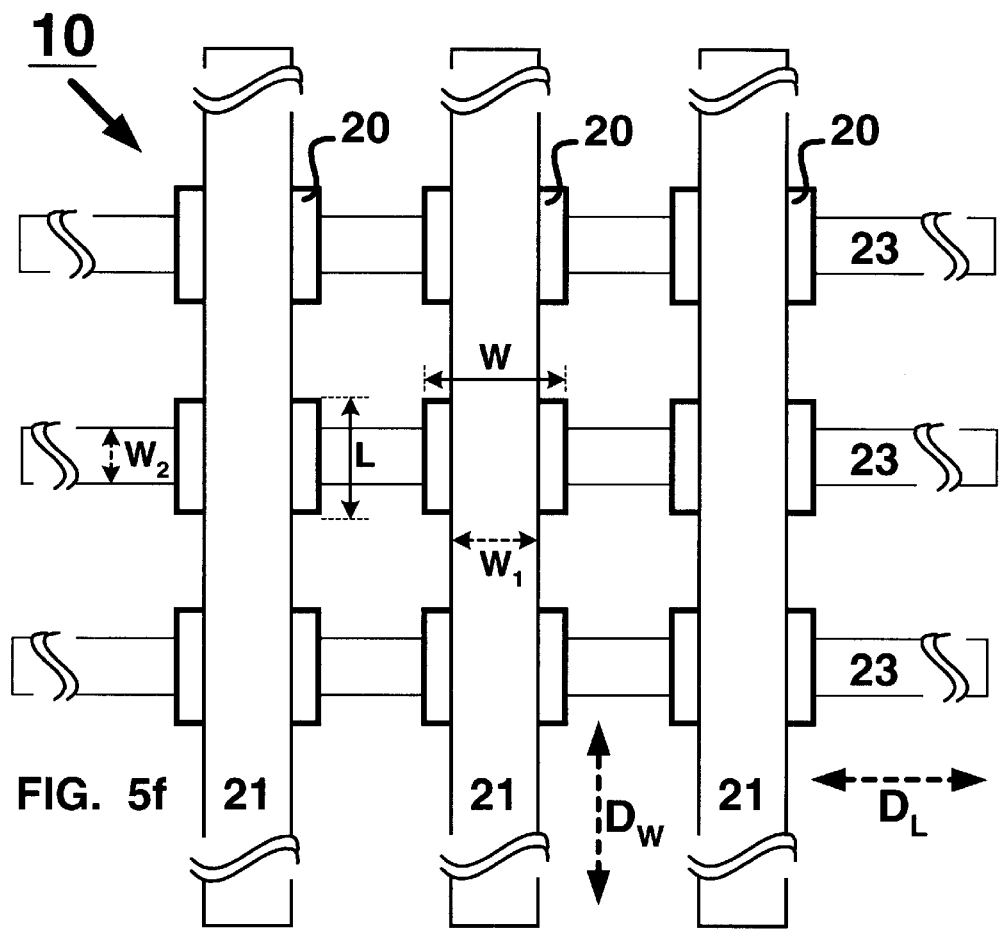

In FIG. 5e, a plurality of the memory cells 20 are arranged in an array of rows and columns to define a magnetic memory device 10. A plurality of the first conductors 21 are arranged in columns and a plurality of the second conductors 23 are arranged in rows. Alternatively, the first conductors 21 can be arranged in rows and the second conductors 23 can arranged in columns.

Each memory cell 20 is positioned at an intersection of the first and second conductors (21, 23) and is disposed intermediate between the first and second conductors (21, 23). A bit of data is written to a selected memory cell (denoted as 20' in FIG. 5e) positioned at an intersection of the first and second conductors (21, 23) by passing a first current $I_1$ through the first conductor 21 and a second current $I_2$ through the second conductor 23 so that the first and second magnetic fields ($H_1$, $H_2$) generated by those currents cooperatively interact with the data layer 11 of memory cell 20' to rotate the alterable orientation of magnetization 17. Power consumption for the aforementioned write operation can be reduced by reducing a magnitude of the first current $I_1$ flowing in the first conductor 21.

It is well understood in the electronics art that a current density J in a conductor is determined by a magnitude of a current I flowing in the conductor and a cross-sectional area A of the conductor such that $J=I \div A$ (in units of A/m$^2$). The magnetic field H is related to the current I flowing in the conductor through Ampere's law: $I=\phi H \cdot dI$. This expression simplifies to $I=H*P$, where P is an enclosed magnetic path around the conductor. Therefore, if I is held constant then H increases with a decrease in P.

For instance, for the first conductor 21, an enclosed magnetic path P is a closed path around the first conductor 21 (i.e. a perimeter of the first conductor 21); therefore, $P=(2*W_1+2*t_1)$. Accordingly, the first magnetic field $H_1 \approx [I_1 \div (2* W_1+2*t_1)]$. Similarly, for the second conductor 23, the second magnetic field $H_2 \approx [I_2 \div (2 *W_2+2*t_2)]$.

It is well understood in the MRAM art that a magnitude of a current sufficient to rotate an alterable orientation of a data layer can be reduced by reducing a width of a conductor that crosses the data layer. The width of the conductor is reduced such that the edges of the conductor are within the edges of the memory cell. As mentioned previously, U.S. Pat. No. 6,236,590 to Bhattacharyya et al. discloses a reduced width conductor. However, a reduction in only the width of the conductor does not yield an equally large reduction in current. For instance, if the width of the conductor is reduced by a factor of 2.0 (i.e. 50%) the magnitude of the current is not reduced by a factor of 2.0.

In accordance with the principles of the present invention, a magnitude of the current required to rotate an alterable orientation of magnetization is further reduced by reducing a thickness of the conductor as well as a width of the conductor such that a cross-sectional area of the conductor is decreased and a current density in the conductor is increased.

In FIG. 6a, the first thickness $t_1$ and the first width $W_1$ of the first conductor 21 are preselected to reduce the first cross-sectional area $A_1$ and to increase a current density $J_1$ in the first conductor 21. The increase in the current density $J_1$ within the first conductor 21 increases a magnitude of the first magnetic field $H_1$ generated by the first current $I_1$.

However, if the first cross-sectional area $A_1$ is reduced and the first current $I_1$ is held constant, then the magnitude of the first magnetic field $H_1$ is more than sufficient to rotate the alterable orientation of magnetization 17 in cooperation with the second magnetic field $H_2$.

Consequently, because the magnitude of the first magnetic field $H_1$ exceeds an actual magnitude that is necessary to rotate the alterable orientation of magnetization 17, a magnitude of the first current $I_1$ can be reduced with a resulting reduction in the first magnetic field $H_1$ such that the reduced magnitude of the first magnetic field $H_1$ is sufficient to rotate the alterable orientation of magnetization 17 in cooperation with the second magnetic field $H_2$. The preselected value for the first width $W_1$ results in the two side surfaces 21s of the first conductor 21 being positioned within the width W of the memory cell 20 (i.e. they are inset from the opposed sides 12s). Although the first conductor 21 is illustrated as being centered between the opposed sides 12s, the first conductor 21 need not be symmetrically positioned between the opposed sides 12s and can be positioned anywhere within the opposed sides 12s.

Benefits of a reduced magnitude of the first current $I_1$ include reduced power consumption, reduced power dissipation (i.e. waste heat generated by current flow), and a reduction in a size of driver circuits that supply the first current $I_1$. The same benefits apply when a magnitude of the second current $I_2$ is reduced as will be described below.

In FIG. 6b, a memory cell 20 can have nominal conductor 21' (cross-sectional view shown in dashed outline) including a nominal width $W_n$, a first nominal thickness $T1_n$, and a first nominal cross-sectional area $A1_n$. Those nominal values can be determined by a set of design rules for fabricating a magnetic memory device. For instance, if the first nominal thickness $T1_n=0.2$ μm and the nominal width $W_n=1.0$ μm, then the first nominal cross-sectional area $A1_n=W_n*T1_n=0.2$ μm$^2$. The nominal width $W_n$ can be greater than or equal to the width W of the memory cell 20. In FIG. 6b, the nominal width $W_n$ is equal to W. In either case, the first width $W_1$ is less than $W_n$ and is less than W. The values for $W_n$, $T1_n$, and $A1_n$ can be used as baseline values for determining the preselected values for $W_1$ and $t_1$.

In FIG. 6b, a cross-sectional view of the first conductor 21 is superimposed with the cross-sectional view of the nominal conductor 21' to illustrate the reduction in the first cross-sectional area $A_1$ ($A_1=W_1*t_1$) relative to the first nominal cross-sectional area $A1_n$ ($A1_n=W_n*T1_n$).

Accordingly, the reduction in the first cross-sectional area $A_1$ can be accomplished by preselecting the first thickness $t_1$ to be less than the first nominal thickness $T1_n$ and preselecting the first width $W_1$ to be less than the nominal width $W_n$. Obviously, in the case where $W=W_n$ the first width $W_1$ can also be preselected to be less than W. For example, with $A1_n=W_n*T1_n=0.2$ μm$^2$, if the first width $W_1=0.5$ μm and the first thickness $t_1=0.1$ μm, then the first cross-sectional area $A_1=W_1*t_1=0.05$ μm$^2$, and the first cross sectional area $A_1$ of the first conductor 21 is reduced by a factor of 4.0 over the first nominal cross-sectional area $A1_n$.

In one embodiment of the present invention, the first width $W_1$ is less than the nominal width $W_n$ by a factor of about 0.60 or less and the first thickness $t_1$ is less than the first nominal thickness $T1_n$ by a factor of about 0.50 or less.

Figure 8B:
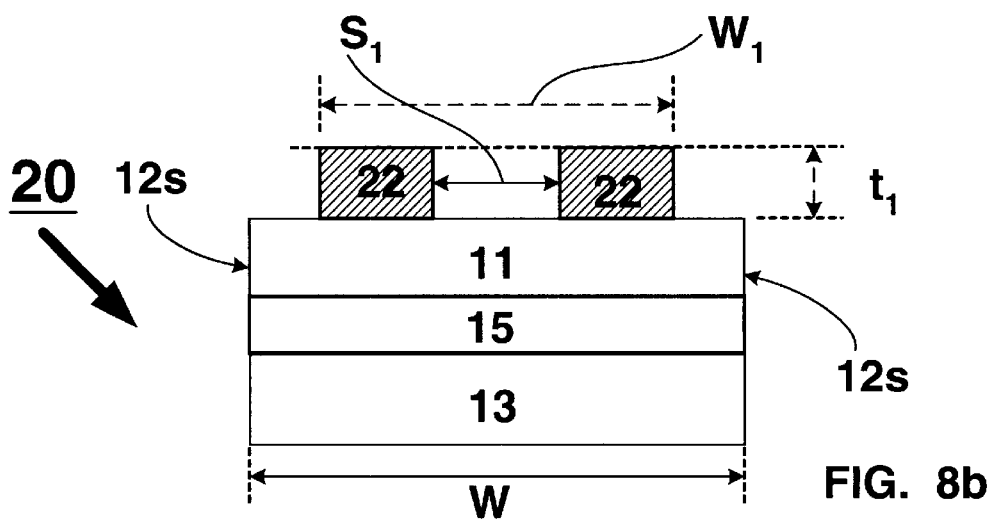
Figure 8C:
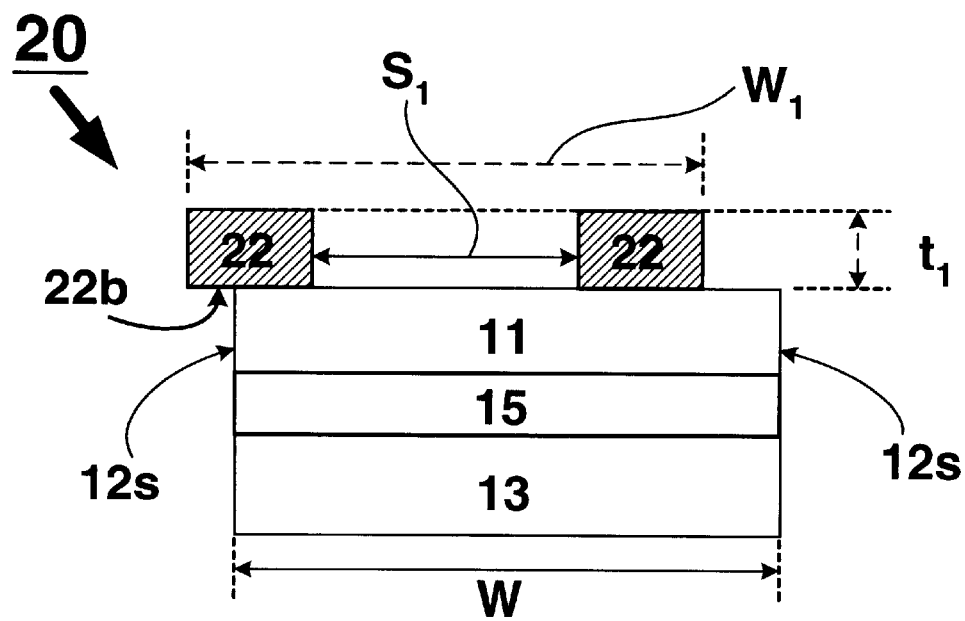

In FIGS. 8a, 8b, and 8c, the first conductor 21 is split into a plurality of spaced apart segments 22 (two are shown). In FIG. 8b, all of the segments 22 are positioned within the width W of the memory cell 20. The segments 22 are spaced apart by a distance $S_1$. The segments 22 have the first thickness $t_1$ as described above. Due to the distance $S_1$ between the segments 22, the segments 22 will have a total combined width that is less than the first width $W_1$ and is less than the width W or the nominal width $W_n$. The segments 22 may have identical widths or they may have widths that vary among the segments 22.

In another embodiment of the present invention, as illustrated in FIG. 8c, at least one of the segments 22 has a portion thereof (i.e. the bottom surface 22b) that is not positioned within the width W of the memory cell 20.

In FIG. 8a, the first current $I_1$ is apportioned among the segments 22 such that one of the segments 22 has a current $I_{11}$ flowing therein and the other segment 22 has a current $I_{12}$ flowing therein. If the segments 22 have substantially equal dimension (i.e. thickness and width) then the currents ($I_{11}$, $I_{12}$) will be substantially equal to each other. On the other hand, if the segments 22 have unequal dimensions, then the currents ($I_{11}$, $I_{12}$) may not be equal to each other.

The segments 22 may be connected in electrical communication with one another by an electrically conductive material 26 that electrically connects the segment 22 with one another. Essentially, the electrically conductive material 26 shorts the segments 22 to one another. A driver circuit (not shown) can supply the first current $I_1$ to the first conductor 21 and the first current $I_1$ will divide and flow through the segments 22. However, the segments 22 need not be in electrical communication with one another and each segment 22 may be electrically connected with a dedicated driver circuit (not shown). Preferably, the segments 22 are connected in electrical communication with one another so that the number of driver circuits is minimized.

In FIGS. 8a and 8b, the first cross-sectional area $A_1$ comprises the combined cross-sectional areas of all the segments 22. The aforementioned reduction in the first current $I_1$ due to the reduced first cross-sectional area $A_1$ also applies when the first conductor 21 is split into the segments 22.

Additional reductions in current consumption in the magnetic memory device 10 of the present invention are achieved by reducing the second cross-sectional area $A_2$ of the second conductor 23 in a manner identical to that described above for the first conductor 21.

In FIGS. 5d, 5f, 7a, and 7b, the two side surfaces 23s of the second conductor 23 are positioned within the length L of the memory cell 20 (i.e. they are inset from the opposed sides 14s). The second thickness $t_2$ and the second width $W_2$ are preselected to reduce the second cross-sectional area $A_2$ and to increase the current density $J_2$ within the second conductor 23. As a result, the magnitude of the second magnetic field $H_2$ sufficient to rotate the alterable orientation of magnetization 17 in cooperation with the first magnetic field $H_1$ is generated by a reduced magnitude of the second current $I_2$.

Figure 7A:
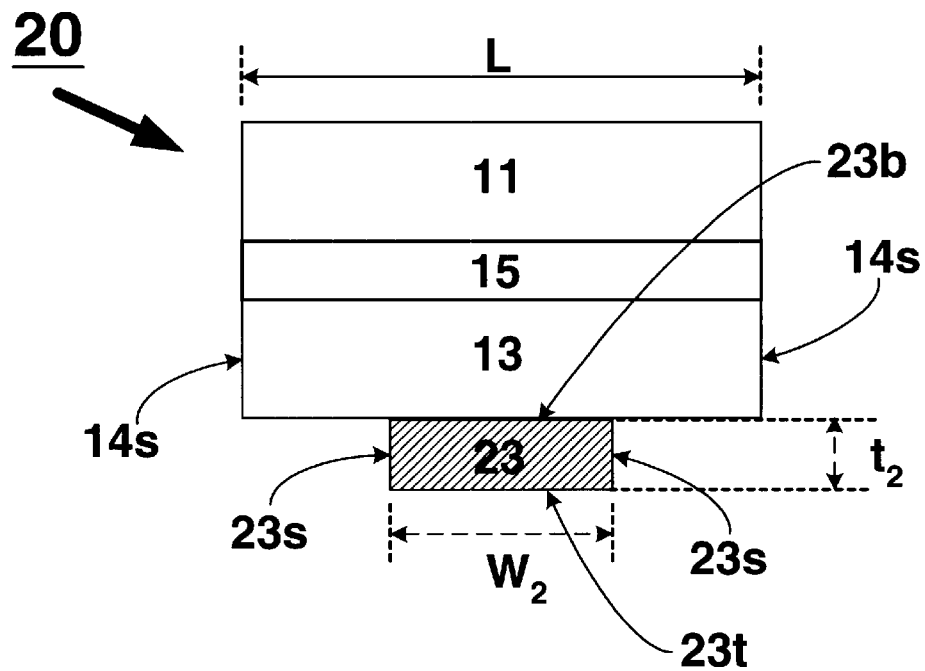
Figure 7B:
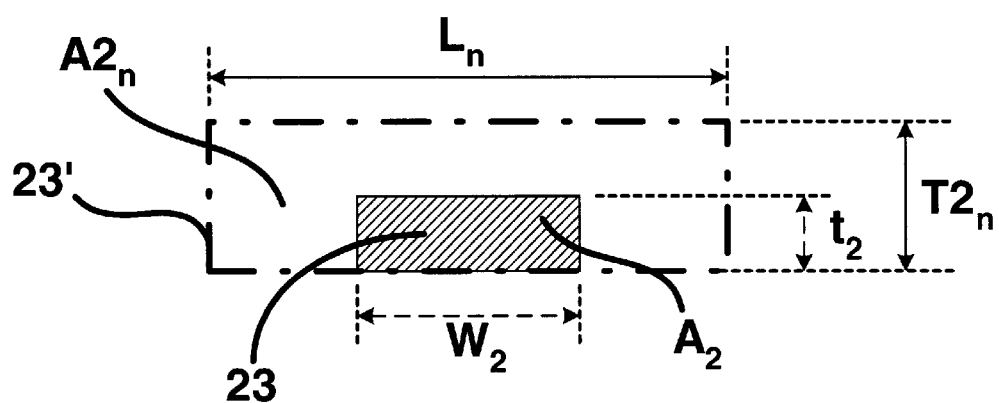

In FIG. 7b, a memory cell 20 can have nominal conductor 23' (cross-sectional view shown in dashed outline) including a nominal length $L_n$, a second nominal thickness $T2_n$, and a second nominal cross-sectional area $A2_n$. Those nominal values can be determined by a set of design rules for fabricating a magnetic memory device. For instance, if the second nominal thickness $T2_n$=0.2 μm and the nominal length $L_n$=0.8 μm, then the second nominal cross-sectional area $A2_n = L_n * T2_n = 0.16$ μm². The nominal length $L_n$ can be greater than or equal to the length L of the memory cell 20. In FIG. 7b, the nominal length $L_n$ is equal to L. In either case, the second width $W_2$ is less than $L_n$ and is less than L.

The values for $L_n$, $T2_n$, and $A2_n$ can be used as baseline values for determining the preselected values for $W_2$ and $t_2$.

In FIG. 7b, a cross-sectional view of the second conductor 23 is superimposed with the cross-sectional view of the nominal conductor 23' to illustrate the reduction in the second cross-sectional area $A_2$ ($A_2 = W_2 * t_2$) relative to the second nominal cross-sectional area $A2_n$ ($A2_n = L_n * T2_n$).

Accordingly, the reduction in the second cross-sectional area $A_2$ can be accomplished by preselecting the second thickness $t_2$ to be less than the second nominal thickness $T2_n$ and preselecting the second width $W_2$ to be less than the nominal length $L_n$. In the case where $L=L_n$ the second width $W_2$ can also be preselected to be less than L. As an example, with $A2_n = L_n * T2_n = 0.16$ μm², if the second width $W_2$=0.4 μm and the second thickness $t_2$=0.1 μm, then the second cross-sectional area $A_2 = W_2 * t_2 = 0.04$ μm², and the second cross sectional area $A_2$ of the second conductor 23 is reduced by a factor of 4.0 over the second nominal cross-sectional area $A2_n$.

In another embodiment of the present invention, the second width $W_2$ is less than the nominal length $L_n$ by a factor of about 0.60 or less and the second thickness $t_2$ is less than the second nominal thickness $T2_n$ by a factor of about 0.50 or less.

Figure 9C:
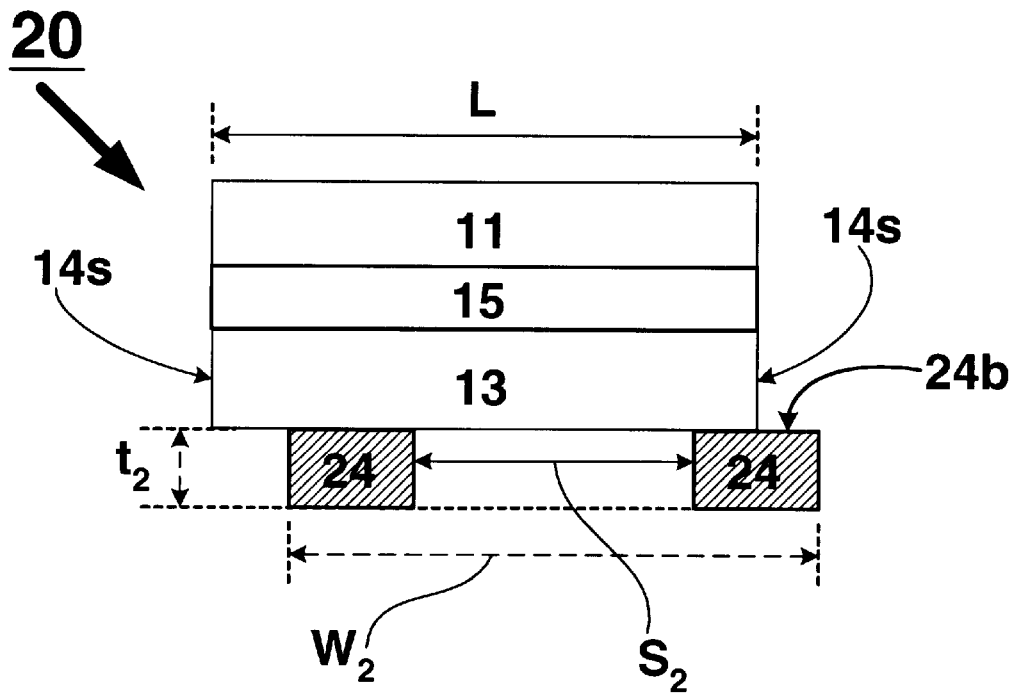
FIGS. 9a, 9b, and 9c are a top view and a cross-sectional view respectively of a pair of conductors that are split into a plurality of spaced apart segments according to the present invention.
Figure 9A:
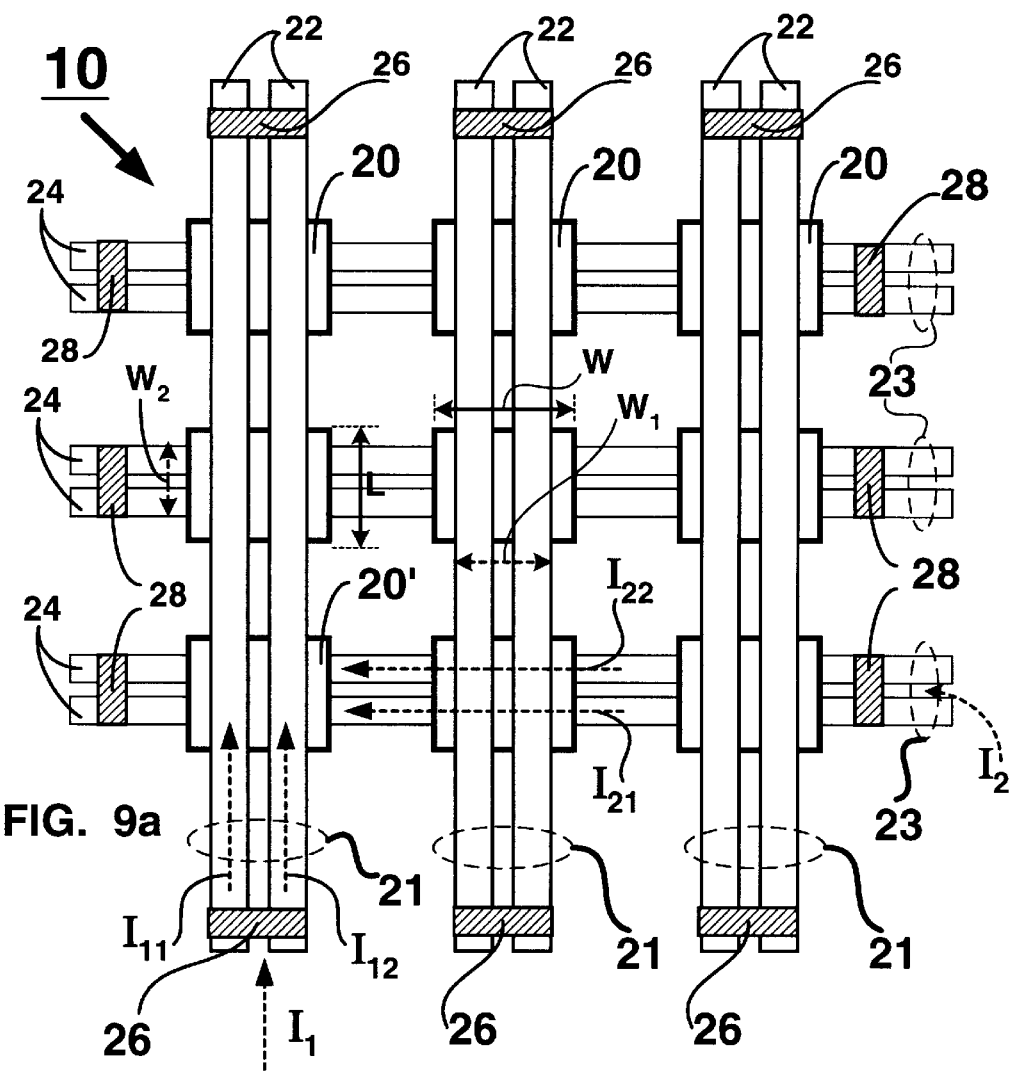
Figure 9B:
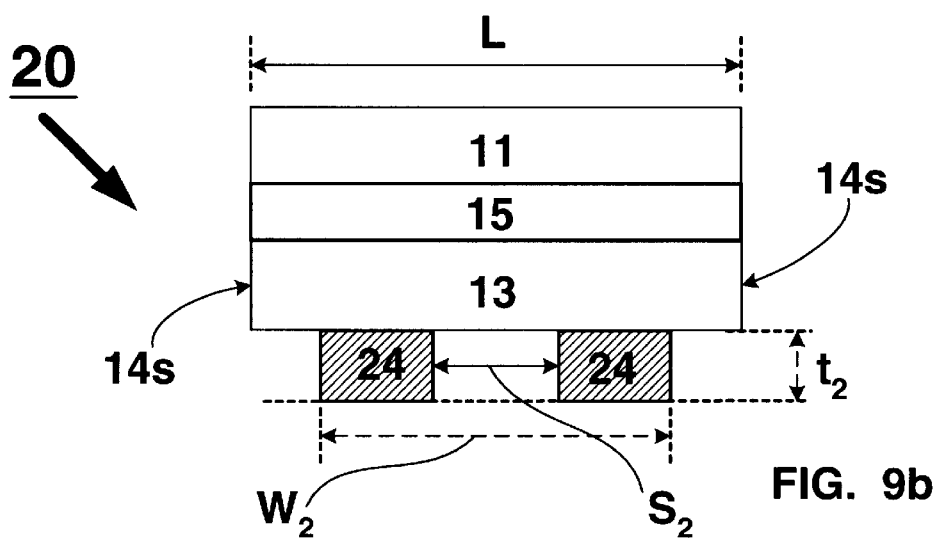

In FIGS. 9a, 9b, and 9c, the second conductor 23 is split into a plurality of spaced apart segments 24 (two are shown). In FIG. 9b, all of the segments 24 are positioned within the length L of the memory cell 20. The segments 24 are spaced apart by a distance $S_2$. The segments 24 have the second thickness $t_2$ as described above. Due to the distance $S_2$ between the segments 24, the segments 24 will have a total combined width that is less than the second width $W_2$ and is less than the length L or the nominal length $L_n$. The segments 24 may have identical widths or they may have widths that vary among the segments 24.

In another embodiment of the present invention, as illustrated in FIG. 9c, at least one of the segments 24 has a portion thereof (i.e. the bottom surface 24b) that is not positioned within the length L of the memory cell 20.

In FIG. 9a, the second current $I_2$ is apportioned among the segments 24 such that one of the segments 24 has a current $I_{21}$ flowing therein and the other segment 24 has a current $I_{22}$ flowing therein. If the segments 24 have substantially equal dimension (i.e. thickness and width) then the currents ($I_{21}$, $I_{22}$) will be substantially equal to each other. On the other hand, if the segments 24 have unequal dimensions, then the currents ($I_{21}$, $I_{22}$) may not be equal to each other.

The segments 24 may be connected in electrical communication with one another by an electrically conductive material 28 that electrically connects the segment 24 with one another. Essentially, the electrically conductive material 28 shorts the segments 24 to one another. A driver circuit (not shown) can supply the second current $I_2$ to the second conductor 23 and the second current $I_2$ will divide and flow through the segments 24. However, the segments 24 need not be in electrical communication with one another and each segment 24 may be electrically connected with a dedicated driver circuit (not shown). Preferably, the segments 24 are connected in electrical communication with one another so that the number of driver circuits is minimized.

In FIGS. 9a and 9b, the second cross-sectional area $A_2$ comprises the combined cross-sectional areas of all the segments 24. The aforementioned reduction in the second current $I_2$ due to the reduced second cross-sectional area $A_2$ also applies when the second conductor 23 is split into the segments 24.

In yet another embodiment of the present invention, also illustrated in FIG. 9a, the first conductor 21 is split into a plurality of the spaced apart segments 22 as was described above in reference to FIGS. 8a, 8b, and 8c. The segments 22 are spaced apart by the distance $S_1$. All of the segments 22 can be positioned within the width W of the memory cell 20 or at least one of the conductors 22 can have a portion thereof that is not positioned within the width W. As a result, both the first and second conductors (21, 23) are split into spaced apart segments (22, 24).

Splitting the conductors (21, 23) into segments (22, 24) enables a concentrated field to be applied to more than one region of the data layer 11. For example, two field sources may be at either end of the data layer 11. Such an arrangement would restrict the switching process to be initiated in the end regions of the data layer 11. This could produce a more reproducible switching process.

One consequence of reducing the cross-sectional area of the first conductor 21 and/or the second conductor 23 is that a resistance of the conductors increases as the cross-sectional area ($A_1$, $A_2$) decreases. A relationship between a resistance to the flow of electrons $R_C$ and the cross-sectional area $A_C$ of a conductor, wherein ρ is a resistivity in Ω-m and I is a length in meters is:

$$R_C = \rho * (I \div A_C) = \rho * [I \div (W_C * t_C)]$$

Therefore, one way of reducing the resistance $R_C$ is to increase the thickness $t_C$, the width $W_C$, or both such that the cross-sectional area $A_C$ of the conductor is increased. The advantages of reducing the width $W_C$ of the conductor have been described above. Accordingly, if the conductor width $W_C$ is less than the length L or width W of the memory cell 20 as described herein, then the thickness $t_C$ must be increased in order to increase the cross-sectional area $A_C$ and reduce the resistance $R_C$.

Figures 14, 15:
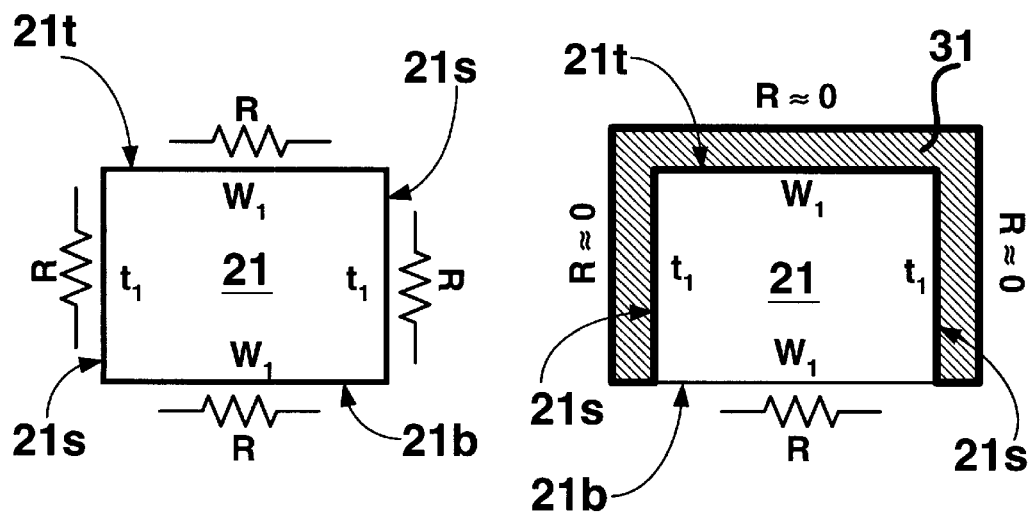
FIG. 14 is a cross-sectional view of a magnetic path around a perimeter of a conductor according to the present invention.
FIG. 15 is a cross-sectional view of a partially cladded conductor according to the present invention.

In FIG. 14, the first conductor 21 has a total magnetic path $P_1$ around a perimeter of the first conductor 21, wherein: $P_1 = (2*W_1) + (2*t_1)$. The first magnetic field $H_1$ generated by the first current $I_1$ flowing in the first conductor 21 is proportional to the first current $I_1$ divided by the total magnetic path $P_1$, such that:

$$H_1 \sim I_1 \div P_1 \sim I_1 \div (2*W_1 + 2*t_1)$$

Although not shown in FIG. 14, the second conductor 23 also includes a perimeter $P_2 = (2*W_2) + (2*t_2)$ and a second magnetic $H_2$ field generated by the second current $I_2$ flowing in the second conductor 23 that is proportional to the second current $I_2$ divided by the total magnetic path $P_2$, such that:

$$H_2 \sim I_2 \div P_2 \sim I_2 \div (2*W_2 + 2*t_2)$$

In FIG. 14, each of the four sides of the first conductor 21 (21t, 21s, and 21b) represent a resistance R to the first magnetic field $H_1$ that is analogous to a voltage drop caused by a series resistance in an electrical circuit. Therefore, an increase in $t_1$ will reduce a magnitude of the first magnetic field $H_1$ because increasing $t_1$ increases the total magnetic path $P_1$.

In FIG. 15, the total magnetic math $P_1$ of the first conductor 21 can be reduced by covering the top surface 21t, the side surfaces 21s, or both (as shown) with a first cladding layer 31. The bottom surface 21b is not covered with a cladding layer (i.e. the first conductor 21 is partially cladded). The first cladding layer 31 is made from a ferromagnetic material. The resistance R for the cladded surfaces (21t, 21s) is substantially R≈0 and the resistance R for the non-cladded surface (21b) remains R. As a result, the total magnetic path $P_1$ becomes $W_1$ and the first magnetic field $H_1 \sim I_1 \div W_1$. By restricting the conductor width $W_1$ to be less than the bit width W, the magnetic field $H_1$ is increased beyond the value for a bit and a conductor having equal widths. Moreover, because of the first cladding layer 31, the first thickness $t_1$ can be increased to increase the first cross-sectional area $A_1$ and reduce a resistance to the flow of electrons in the first conductor 21.

Similarly, the total magnetic path $P_2$ for the second conductor 23 can be reduced by covering the top surface 23t, the side surfaces 23s, or both (see FIG. 11a) with a second cladding layer 33. The bottom surface 23b is not covered with a cladding layer (i.e. the second conductor 23 is partially cladded). The second cladding layer 33 is also made from a ferromagnetic material. Accordingly, total magnetic path $P_2$ becomes $W_2$ and the second magnetic field $H_2 \sim I_2 \div W_2$. The second cladding layer 33 allows for the thickness $t_2$ to be increased thereby increasing the second cross-sectional area $A_2$ and reducing a resistance to the flow of electrons in the second conductor 23.

Benefits of a reduced conductor widths ($W_1$, $W_2$) for the first and second conductors (21, 23) include a reduction in the first and second currents ($I_1$, $I_2$) and a reduction in the size or the write driver circuits. Benefits of a reduced resistance included a reduction in power consumption and power dissipation, and a reduction in a supply voltage for the driver circuits that supply the first and second currents ($I_1$, $I_2$). In addition, increased conductor cross-sectional area mitigates electromigration concerns.

Figure 10A:
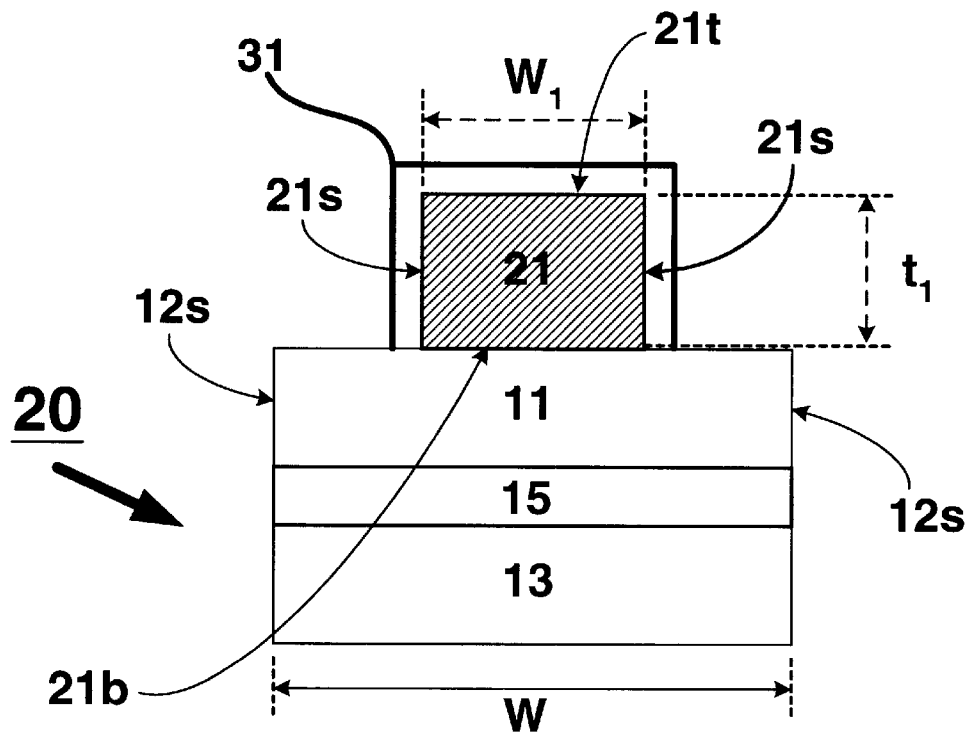
FIGS. 10a and 11a are cross-sectional views of cladded conductors having a reduced width and an increased thickness according to the present invention.
Figure 10B:
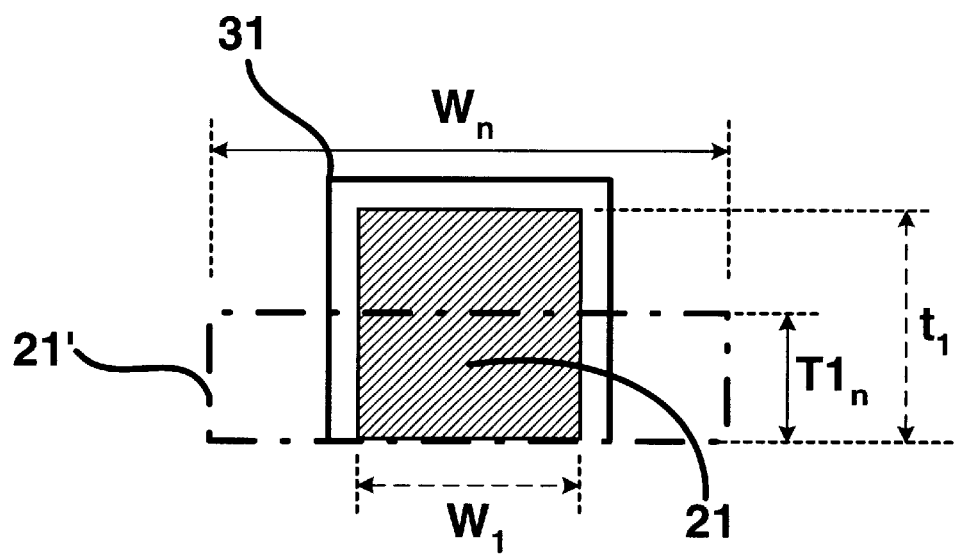
FIGS. 10b and 11b are cross-sectional views depicting the reduced width and increased thickness conductors of FIGS. 10a and 11a respectively, in relation to a conductor having a nominal width, a nominal length, and a nominal thickness according to the present invention.

In one embodiment of the present invention, as illustrated in FIGS. 10a and 10b, a conductor structure for a magnetic memory device 10 includes the memory cell 20 as described above. A first conductor 21 crosses the memory cell 20 in the width direction $D_W$ and is operative to generate the first magnetic field $H_1$ in response to the first current $I_1$ flowing therein. The first conductor 21 includes the first width $W_1$ and the first thickness $t_1$ that define the first cross-sectional area $A_1$. The first conductor further includes the top surface 21t, the two side surfaces 21s positioned within the width W of the memory cell 20 (i.e. the side surfaces 21s are inset from the opposed sides 12s) and the bottom surface 21b positioned adjacent to the memory cell 20.

The first conductor 21 includes a first cladding layer 31. The first cladding layer 31 can cover: the top surface 21t; the two side surfaces 21s; or the top surface 21t and the two side surfaces 21s. The first cladding layer 31 operatively decreases the total magnetic $P_1$ and increases the first magnetic field $H_1$ as was described above in reference to FIG. 15.

A second conductor 23 crosses the memory cell 20 in the length direction $D_L$ and is operative to generate the second magnetic field $H_2$ in response to the second current $I_2$ flowing therein. The second conductor includes the second width $W_2$ and the second thickness $t_2$ that define the second cross-sectional area $A_2$, and the second conductor includes the top surface 23t, the two side surfaces 23s, and the bottom surface 23b positioned adjacent to the memory cell 20. As discussed previously, the first and second magnetic fields ($H_1$, $H_2$) cooperatively interact with the data layer 11 to rotate the alterable orientation of magnetization 17.

In the embodiment illustrated in FIGS. 10a and 10b, the first width $W_1$ is less than the width W of the memory cell 20 and the first thickness $t_1$ is preselected to increase the first cross-sectional area $A_1$. As was described above in reference to FIGS. 14 and 15, the increase in the first cross-sectional area $A_1$ reduces a resistance of the first conductor 21. The reduced conductor width $W_1$ ensures that the magnitude of the first magnetic field $H_1$ is sufficient to rotate the alterable orientation of magnetization 17 in cooperation with the second magnetic field $H_2$ at a reduced magnitude of the first current $I_1$.

In FIG. 10b, a cross-sectional view of an outline of a nominal conductor 21' having a nominal width $W_n$ and a first nominal thickness $T1_n$ is depicted. Those nominal values can be determined by a set of design rules for fabricating the magnetic memory cell 20 as was described above. The first width $W_1$ is less than the nominal width $W_n$. Because the two side surfaces 22s are inset from the opposed sides 12s, the first width $W_1$ will also be less than the width W. The values for $W_n$ and $T1_n$ can be used as baseline values for determining the values for $W_1$ and $t_1$.

However, unlike the embodiment illustrated in FIG. 6b, in FIG. 10b the increase in the first cross-sectional area $A_1$ can be accomplished by preselecting the first thickness $t_1$ to be greater than the first nominal thickness $T1_n$ (i.e. $t_1 > T1_n$). For instance, if the first nominal thickness $T1_n = 0.2$ μm, then the first thickness $t_1$ can be preselected to be 0.4 μm.

In one embodiment of the present invention, the first width $W_1$ is less than the nominal width $W_n$ by a factor of about 0.60 or less and the first thickness $t_1$ is greater than the first nominal thickness $T1_n$ by a factor of about 1.50 or more.

Figure 11A:
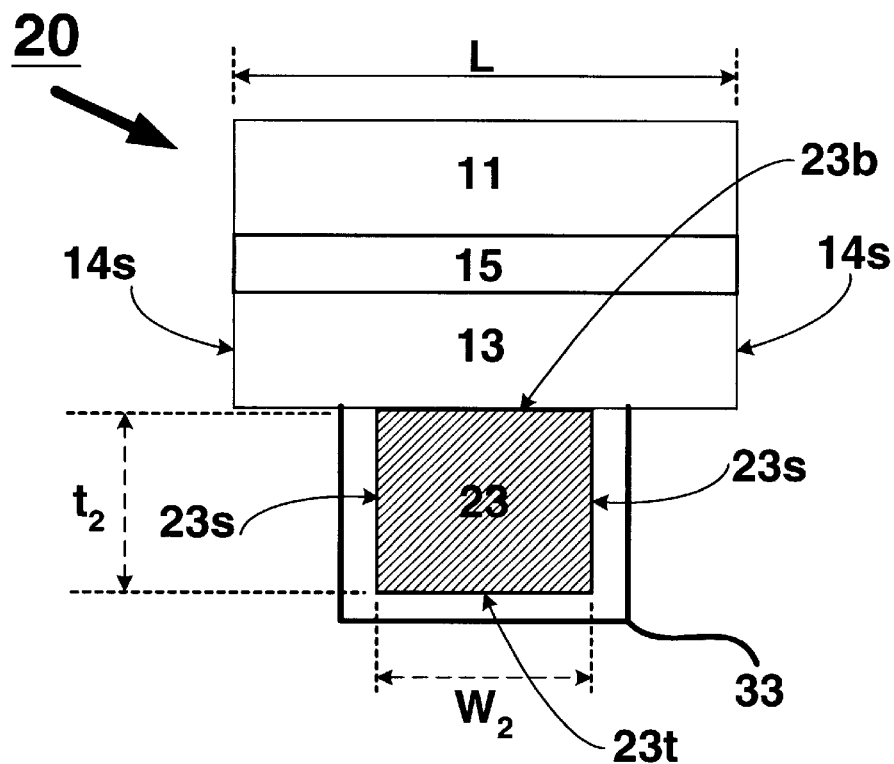
Figure 11B:
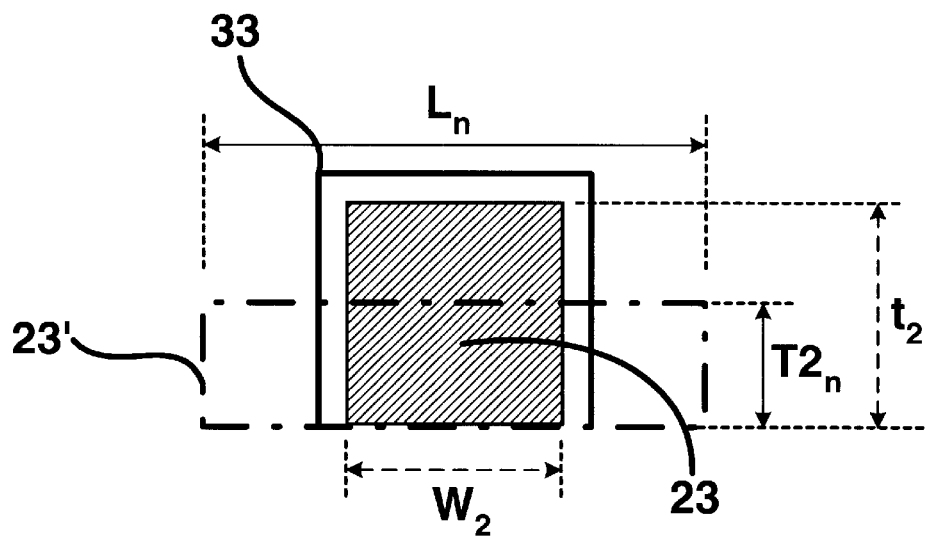

Additional reductions in power consumption can be realized by another embodiment of the present invention, as illustrated in FIGS. 11a and 11b, wherein the second conductor 23 includes a second cladding layer 33. The second cladding layer 33 can cover: the top surface 23t; the two side surfaces 23s; or the top surface 23t and the two side surfaces 23s. The second cladding layer 33 operatively decreases the total magnetic path $P_2$ and increases the second magnetic field $H_2$ as was described above in reference to FIG. 15.

As illustrated in FIGS. 11a and 11b, The two side surfaces 23s are positioned within the length L of the memory cell 20 (i.e. they are inset from the opposed sides 14s). The nominal length $L_n$ can be greater than or equal to the length L of the memory cell 20. The second width $W_2$ can be less than the nominal length $L_n$ of the memory cell 20. Because the two side surfaces 23s are inset from the opposed sides 14s, the second width $W_2$ will also be less than the length L.

The second thickness $t_2$ is preselected to increase the second cross-sectional area $A_2$ and to reduce a resistance of the second conductor 23. The reduced conductor width $W_2$ ensures that the magnitude of the second magnetic field $H_2$ is sufficient to rotate the alterable orientation of magnetization 17 in cooperation with the first magnetic field $H_1$ at a reduced magnitude of the second current $I_2$.

In FIG. 11b, the increase in the second cross-sectional area $A_2$ can be accomplished by preselecting the second thickness $t_2$ to be greater than the second nominal thickness $T2_n$ (i.e. $t_2 > T2_n$). For example, if the second nominal thickness $T2_n = 0.3$ μm, then the second thickness $t_2$ can be preselected to be 0.7 μm.

In one embodiment of the present invention, the second width $W_2$ is less than the nominal length $L_n$ by a factor of about 0.60 or less and the second thickness $t_2$ is greater than the second nominal thickness $T2_n$ by a factor of about 1.50 or more.

Figure 12A:
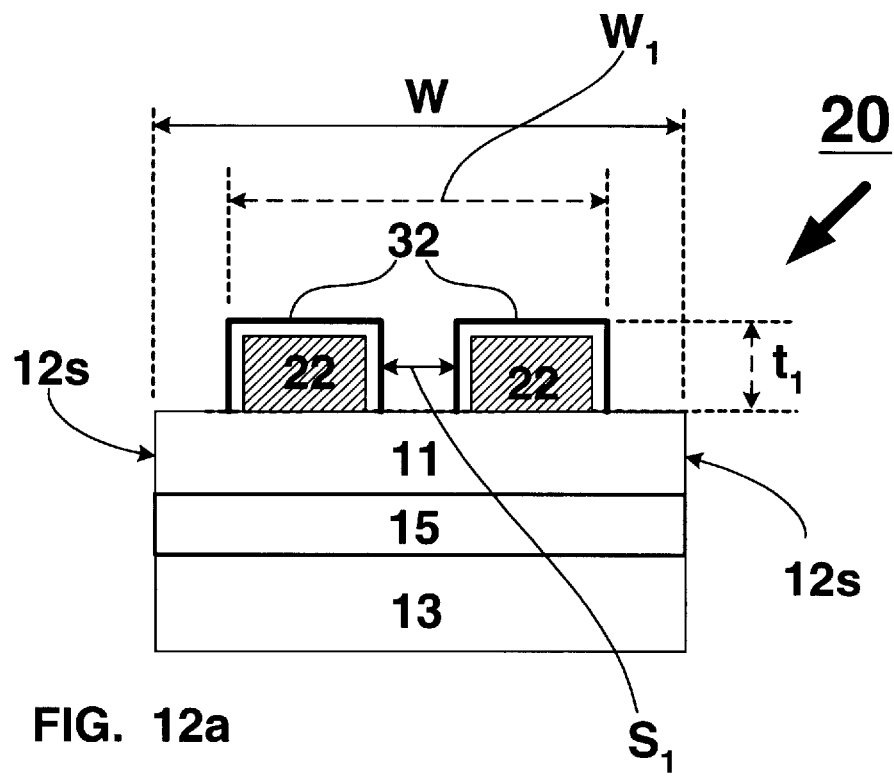
FIGS. 12a, 12b, 12c, and 12d are cross-sectional views of partially cladded conductors having a reduced width and an increased thickness that are split into a plurality of spaced apart cladded segments according to the present invention.

In yet another embodiment of the present invention, as illustrated in FIG. 12a, the first conductor 21 is split into a plurality (two are shown) of spaced apart and cladded segments 22. In a manner identical to the first conductor 21, each cladded segment 22 has a top surface, two side surfaces, and a bottom surface positioned adjacent to the memory cell 20. The cladded segments 22 are spaced apart by a distance $S_1$.

A cladding layer 32 can cover: the top surface; the two side surfaces; or the top surface and the two side surfaces (i.e. the cladded segments 22 are partially cladded). In FIG. 12a, all of the surfaces of the conductors 22, save the bottom surface, are covered by the cladding layer 32. The cladding layer 32 reduces the total magnetic path $P_1$ as was described above. Each cladded segment 22 has the first thickness $t_1$ that is preselected to increase the first cross-sectional area $A_1$ thereby reducing a resistance to the flow of electrons in each cladded segment 22.

Figure 12B:
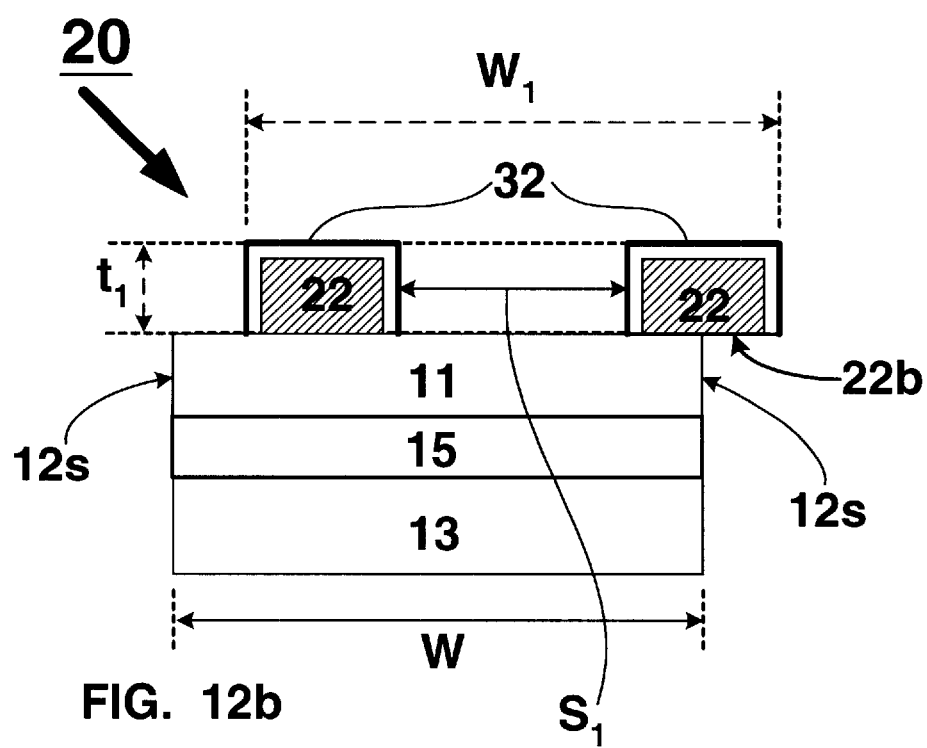

In one embodiment of the present invention, as illustrated in FIG. 12a, all of the cladded segments 22 are positioned within the width W of the memory cell 20. In another embodiment of the present invention, as illustrated in FIG. 12b, at least one of the cladded segments 22 has a portion thereof (i.e. the bottom surface 22b) that is not positioned within the width W of the memory cell 20.

Figure 12C:
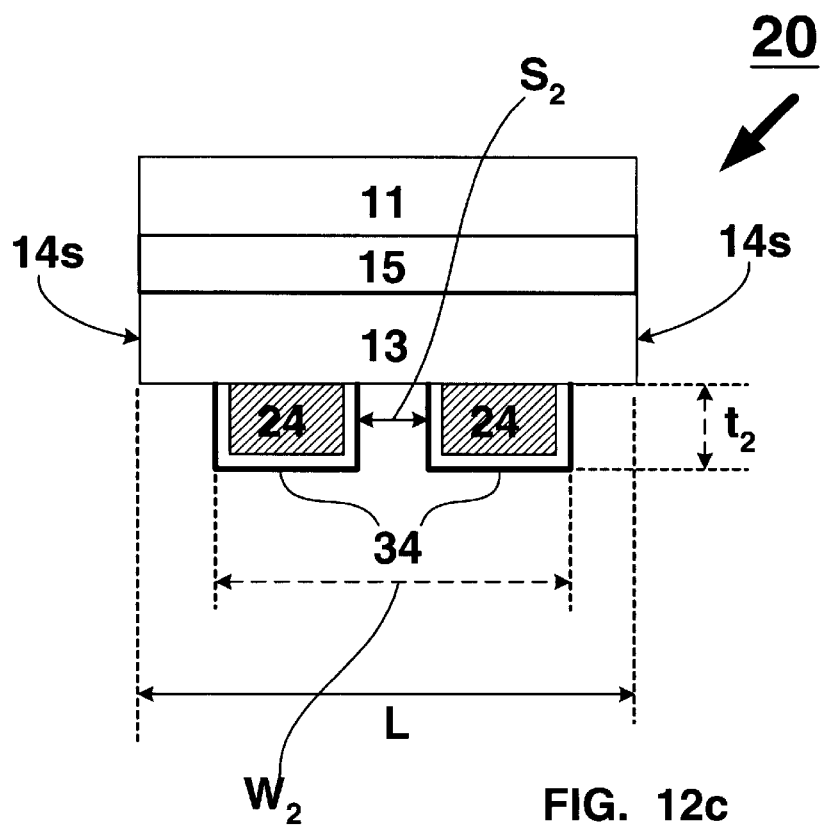

Similarly, in FIG. 12c, the second conductor 23 is split into a plurality (two are shown) of spaced apart and cladded segments 24. In a manner identical to the second conductor 23, each cladded segment 24 has a top surface, two side surfaces, and a bottom surface positioned adjacent to the memory cell 20. The cladded segments 24 are spaced apart by a distance $S_2$.

A cladding layer 34 can cover: the top surface; the two side surfaces; or the top surface and the two side surfaces (i.e. the cladded segments 24 are partially cladded). In FIG. 12c, all of the surfaces of the cladded segments 24, save the bottom surface, are covered by the cladding layer 34. The cladding layer 34 reduces the total magnetic path $P_2$ as was described above. Each cladded segment 24 has the second thickness $t_2$ that is preselected to increase the second cross-sectional area $A_2$ thereby reducing a resistance to the flow of electrons in each cladded segment 24.

Figure 12D:
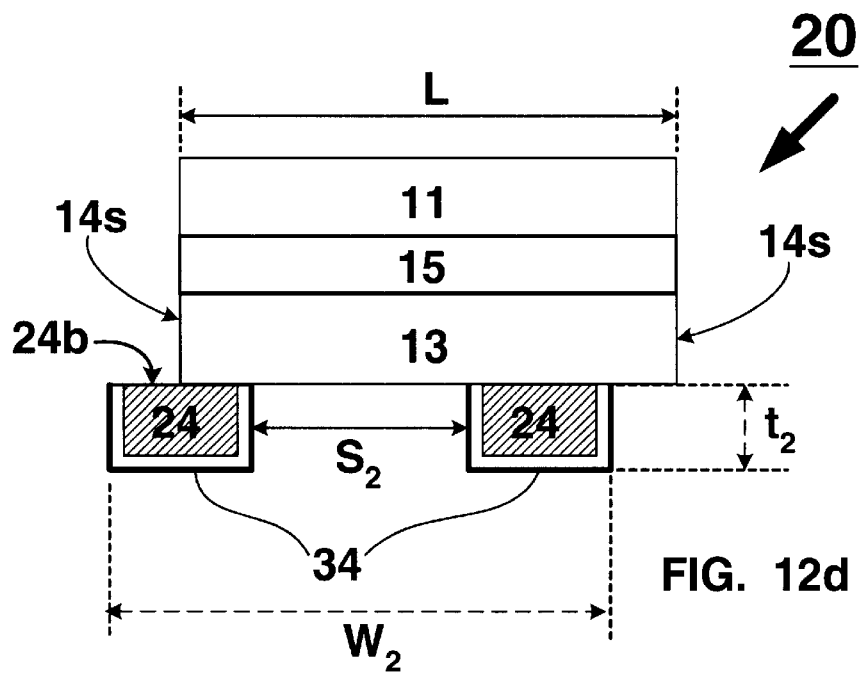

In one embodiment of the present invention, as illustrated in FIG. 12c, all of the cladded segments 24 are positioned within the length L of the memory cell 20. In another embodiment of the present invention, as illustrated in FIG. 12d, at least one of the cladded segments 24 has a portion thereof (i.e. the bottom surface 24b) that is not positioned within the length L of the memory cell 20.

In one embodiment of the present invention, as illustrated in FIGS. 9a, 12a, and 12c, both the first and second conductors (21, 23) are split into the spaced apart and cladded segments (22, 24). The cladding layer 32 covers the cladded segment 22 and the cladding layer 34 covers the cladded segments 24.

Figure 13A:
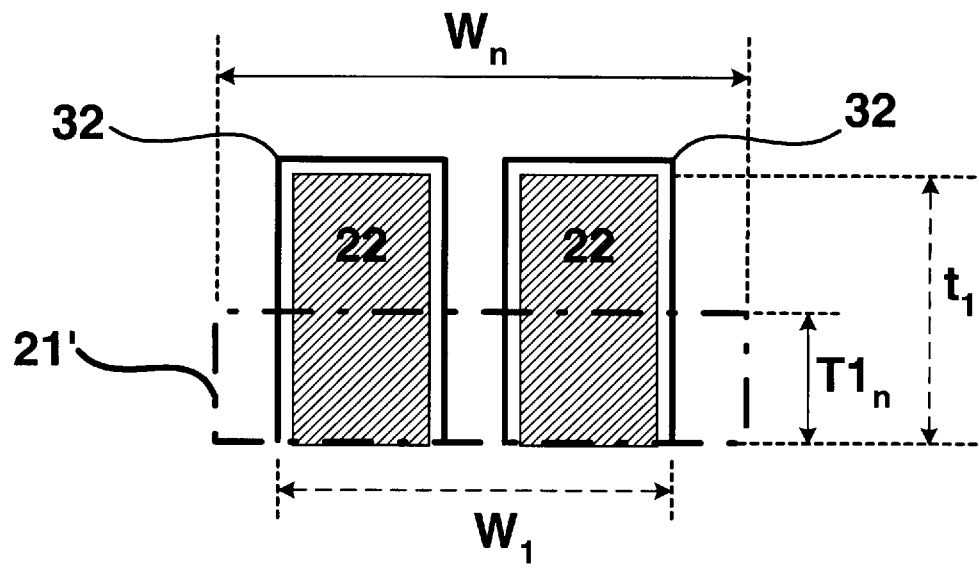
FIGS. 13a and 13b are cross-sectional views of the spaced apart and partially cladded segments of FIGS. 12a and 12c and 12b and 12d respectively, in relation to conductors having a nominal width, a nominal length, and a nominal thickness according to the present invention.
Figure 13B:
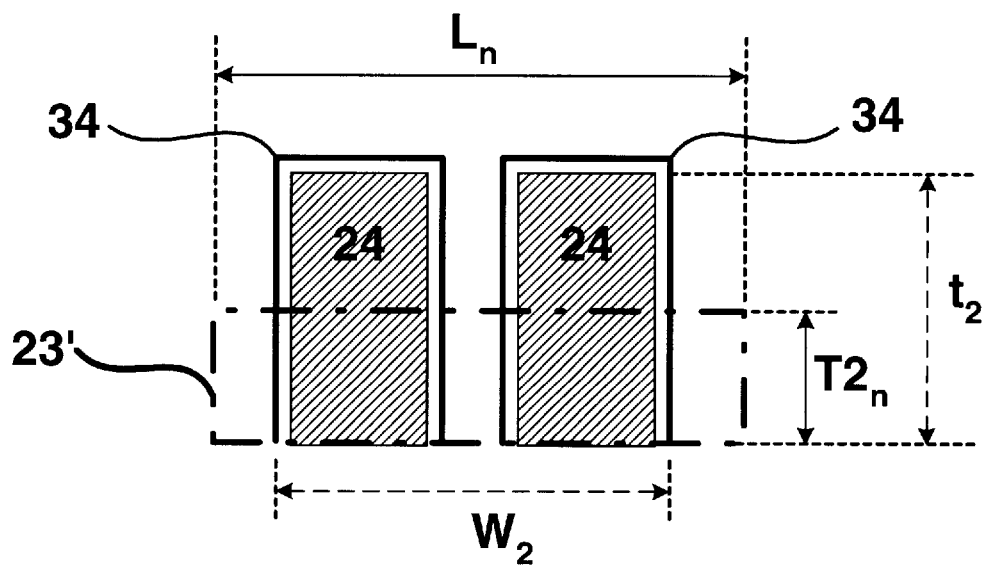

In FIGS. 13a and 13b, cross-sectional views of the cladded segments (22, 24) are superimposed with a cross-sectional view of nominal conductors (21', 23') (shown in dashed outline) to illustrate the increased thicknesses ($t_1$, $t_2$) of the cladded segments (22, 24) relative to the first and second nominal thicknesses of the nominal conductor (21', 23'). As mentioned above, the increased thicknesses ($t_1$, $t_2$) increase the cross-sectional areas ($A_1$, $A_2$) of the cladded segments (22, 24) and result in a reduced resistance to the flow of electrons in the cladded segments (22, 24).

Splitting the conductors (21, 23) into two or more cladded segments (22, 24) enables a concentrated field to be applied to more than one region of the data layer 11. For example, two field sources may be at either end of the data layer 11. Such an arrangement restricts the switching process to be initiated in the end regions of the data layer 11. This could produce a more reproducible switching process.

For the embodiments described herein, the cladding layers (31, 33, 32, 34) can be a ferromagnetic material.

Preferably, the cladding layers (31, 33, 32, 34) are made from a high magnetic permeability soft magnetic material including but not limited to a nickel iron alloy, a nickel iron cobalt alloy, a cobalt iron alloy, and PERMALLOY™.

The conductors (21, 23, 22, 24) can be made from an electrically conductive material including but not limited to copper, aluminum, aluminum copper, tantalum, gold, silver, and alloys of those electrically conductive materials. Although the conductors (21, 23, 22, 24) as illustrated herein were depicted in contact with the data layer 11 or the reference layer 13, those configurations were for purposes of illustration only and the conductors (21, 23, 22, 24) may be separated from the data layer 11 or the reference layer 13 by one or more layers of material that comprise the structure for the memory cell 20.

Although several embodiments of the present invention have been disclosed and illustrated, the invention is not limited to the specific forms or arrangements of parts so described and illustrated. The invention is only limited by the claims.

What is claimed is:

1. A conductor structure for a magnetic memory device including a magnetic field sensitive memory cell including a width, a length, and a data layer for storing a bit of data as an alterable orientation of magnetization, comprising:
   a first conductor crossing the memory cell in a width direction and operative to generate a first magnetic field in response to a first current flowing therein, the first conductor including a first width and a first thickness defining a first cross-sectional area, a top surface, two side surfaces positioned within the width of the memory cell, and a bottom surface positioned adjacent to the memory cell;
   a second conductor crossing the memory cell in a length direction and operative to generate a second magnetic field in response to a second current flowing therein, the second conductor including a second width and a second thickness defining a second cross-sectional area, a top surface, two side surfaces, and a bottom surface positioned adjacent to the memory cell, and wherein the second width is substantially greater than or equal to the length of the memory cell,
   the first and second magnetic fields cooperatively interact with the data layer to rotate the alterable orientation of magnetization, and
   wherein the first thickness and the first width are preselected to decrease the first cross-sectional area and to increase a current density in the first conductor so that a magnitude of the first magnetic field sufficient to rotate the alterable orientation of magnetization in cooperation with the second magnetic field is generated by a reduced magnitude of the first current.

2. The conductor structure as set forth in claim 1, wherein the first width is less than a nominal width and the first thickness is less than a first nominal thickness.

3. The conductor structure as set forth in claim 2, wherein the first width is less than the nominal width by a factor of about 0.60 or less and the first thickness is less than the first nominal thickness by a factor of about 0.50 or less.

4. The conductor structure as set forth in claim 1, wherein the first conductor is split into a plurality of spaced apart segments and wherein the segments have a position relative to the width of the memory cell selected from the group consisting of all of the segments are positioned within the width of the memory cell and at least one of the segments has a portion thereof that is not positioned within the width of the memory cell.

5. The conductor structure as set forth in claim 1, wherein the two side surfaces of the second conductor are positioned within the length of the memory cell and the second thickness and the second width are preselected to decrease the second cross-sectional area and to increase a current density in the second conductor so that a magnitude of the second magnetic field sufficient to rotate the alterable orientation of magnetization in cooperation with the first magnetic field is generated by a reduced magnitude of the second current.

6. The conductor structure as set forth in claim 5, wherein the second width is less than a nominal length and the second thickness is less than a second nominal thickness.

7. The conductor structure as set forth in claim 6, wherein the second width is less than the nominal length by a factor of about 0.60 or less and the second thickness is less than the second nominal thickness by a factor of about 0.50 or less.

8. The conductor structure as set forth in claim 5, wherein the second conductor is split into a plurality of spaced apart segments and wherein the segments have a position relative to the length of the memory cell selected from the group consisting of all of the segments are positioned within the length of the memory cell and at least one of the segments has a portion thereof that is not positioned within the length of the memory cell.

9. The conductor structure as set forth in claim 8, wherein the first conductor is split into a plurality of spaced apart segments and wherein the segments have a position relative to the width of the memory cell selected from the group consisting of all of the segments are positioned within the width of the memory cell and at least one of the segments has a portion thereof that is not positioned within the width of the memory cell.

10. A conductor structure for a magnetic memory device including a magnetic field sensitive memory cell having a width, a length, and a data layer for storing a bit of data as an alterable orientation of magnetization, comprising:
    a first conductor crossing the memory cell in a width direction and operative to generate a first magnetic field in response to a first current flowing therein, the first conductor including a first width and a first thickness defining a first cross-sectional area, a top surface, two side surfaces positioned within the width of the memory cell, and a bottom surface positioned adjacent to the memory cell;
    a first cladding layer covering the first conductor on a surface selected from the group consisting of the top surface, the two side surfaces, and the top surface and the two side surfaces;
    a second conductor crossing the memory cell in a length direction and operative to generate a second magnetic field in response to a second current flowing therein, the second conductor including a second width and a second thickness defining a second cross-sectional area, a top surface, two side surfaces, and a bottom surface positioned adjacent to the memory cell,
    the first and second magnetic fields cooperatively interact with the data layer to rotate the alterable orientation of magnetization, and
    wherein the first thickness is preselected to increase the first cross-sectional area and to reduce a resistance of the first conductor, and wherein the first width is preselected such that a magnitude of the first magnetic field is sufficient to rotate the alterable orientation of magnetization in cooperation with the second magnetic field is at a reduced magnitude of the first current.

11. The conductor structure as set forth in claim 10, wherein the first width is less than a nominal width and the first thickness is greater than a first nominal thickness.

12. The conductor structure as set forth in claim 11, wherein the first width is less than the nominal width by a factor of about 0.60 or less and the first thickness is greater than the first nominal thickness by a factor of about 1.50 or more.

13. The conductor structure as set forth in claim 10, wherein the first conductor is split into a plurality of spaced apart and cladded segments and wherein the cladded segments have a position relative to the width of the memory cell selected from the group consisting of all of the cladded segments are positioned within the width of the memory cell and at least one of the cladded segments has a portion thereof that is not positioned within the width of the memory cell.

14. The conductor structure as set forth in claim 10 and further comprising a second cladding layer covering the second conductor on a surface selected from the group consisting of the top surface, the two side surfaces, and the top surface and the two side surfaces, the second cladding layer operative to increase the second magnetic field, and wherein the two side surfaces of the second conductor are positioned within the length of the memory cell and the second thickness is preselected to increase the second cross-sectional area and to reduce a resistance of the second conductor, and wherein the second width is preselected such that a magnitude of the second magnetic field is sufficient to rotate the alterable orientation of magnetization in cooperation with the first magnetic field is at a reduced magnitude of the second current.

15. The conductor structure as set forth in claim 14, wherein the second width is less than a nominal length and the second thickness is greater than a second nominal thickness.

16. The conductor structure as set forth in claim 15, wherein the second width is less than the nominal length by a factor of about 0.60 or less and the second thickness is greater than the second nominal thickness by a factor of about 1.50 or more.

17. The conductor structure as set forth in claim 14, wherein the second conductor is split into a plurality of spaced apart and cladded segments and wherein the cladded segments have a position relative to the length of the memory cell selected from the group consisting of all of the cladded segments are positioned within the length of the memory cell and at least one of the cladded segments has a portion thereof that is not positioned within the length of the memory cell.

18. The conductor structure as set forth in claim 17, wherein the first conductor is split into a plurality of spaced apart and cladded segments and wherein the cladded segments have a position relative to the width of the memory cell selected from the group consisting of all of the cladded segments are positioned within the width of the memory cell and at least one of the cladded segments has a portion thereof that is not positioned within the width of the memory cell.

* * * * *